United States Patent
Seo et al.

(10) Patent No.: US 9,690,896 B2
(45) Date of Patent: Jun. 27, 2017

(54) METHOD FOR MANUFACTURING A SEMICONDUCTOR DEVICE AND SEMICONDUCTOR DEVICE MANUFACTURED BY THE SAME

(71) Applicant: SAMSUNG ELECTRONICS CO., LTD., Suwon-si (KR)

(72) Inventors: Jae-Woo Seo, Seoul (KR); Jaeha Lee, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/094,280

(22) Filed: Apr. 8, 2016

(65) Prior Publication Data
US 2016/0300840 A1  Oct. 13, 2016

(30) Foreign Application Priority Data

Apr. 9, 2015 (KR) .................. 10-2015-0050150
Oct. 21, 2015 (KR) .................. 10-2015-0146729

(51) Int. Cl.
*H01L 21/00* (2006.01)
*G06F 17/50* (2006.01)
(Continued)

(52) U.S. Cl.
CPC ...... *G06F 17/5077* (2013.01); *G06F 17/5072* (2013.01); *G06F 17/5081* (2013.01);
(Continued)

(58) Field of Classification Search
CPC ..... H01L 21/823871; H01L 21/823807; H01L 21/823814; H01L 21/76892; H01L 23/528; H01L 27/0207
See application file for complete search history.

(56) References Cited

U.S. PATENT DOCUMENTS 6,054,872 A    4/2000  Fudanuki et al.
6,536,028 B1   3/2003  Katsioulas et al.
               (Continued)

FOREIGN PATENT DOCUMENTS

JP    H 8-213466 A    8/1996
JP    H 9-185641 A    7/1997
                (Continued)

OTHER PUBLICATIONS

"Physical Library Analysis for Optimal 28-nm and 20-nm Routing", Router CAE, Synopsys 2012, Jul. 15, 2013, pp. 1-63 (Total 63 pages).

(Continued)

*Primary Examiner* — Nicholas Tobergte
(74) *Attorney, Agent, or Firm* — Sughrue Mion, PLLC

(57) ABSTRACT

A method for manufacturing a semiconductor device is provided. The method includes disposing pre-conductive lines and post-conductive lines for forming first and second cells. The first and second cells are adjacent to each other in a first direction. A first conductive line of the first cell extends in a second direction perpendicular to the first direction and is adjacent to a boundary between the first and second cells. A second conductive line and a third conductive line of the second cell extend in the first direction and are adjacent to the boundary. The second and third conductive lines are respectively disposed on two non-adjacent tracks, among a plurality of tracks that extend in the first direction. The first conductive line intersects one of the two non-adjacent tracks and one track disposed between the two non-adjacent tracks.

20 Claims, 24 Drawing Sheets

(51) Int. Cl.
*H01L 21/8238* (2006.01)
*H01L 21/768* (2006.01)
*H01L 23/528* (2006.01)
*H01L 27/02* (2006.01)

(52) U.S. Cl.
CPC ........ *H01L 21/76892* (2013.01); *H01L 21/823807* (2013.01); *H01L 21/823814* (2013.01); *H01L 21/823871* (2013.01); *H01L 23/528* (2013.01); *H01L 27/0207* (2013.01)

(56) References Cited

U.S. PATENT DOCUMENTS

| | | | |
|---|---|---|---|
| 7,039,881 | B2 | 5/2006 | Regan |
| 7,299,440 | B2 | 11/2007 | Yoshida et al. |
| 7,302,660 | B2 | 11/2007 | Shimamura |
| 7,321,139 | B2 | 1/2008 | Chang et al. |
| 7,888,705 | B2 | 2/2011 | Becker et al. |
| 7,919,792 | B2 | 4/2011 | Law et al. |
| 7,989,849 | B2 | 8/2011 | Sherlekar et al. |
| 8,063,414 | B2 | 11/2011 | Uchida |
| 8,176,457 | B2 | 5/2012 | Kato et al. |
| 8,220,696 | B2 | 7/2012 | Kawada |
| 8,239,807 | B2 | 8/2012 | Arora et al. |
| 8,255,837 | B2 | 8/2012 | Lu et al. |
| 8,327,301 | B2 | 12/2012 | Cheng et al. |
| 8,357,955 | B2 | 1/2013 | Tanaka |
| 8,513,978 | B2 | 8/2013 | Sherlekar |
| 8,584,052 | B2 | 11/2013 | Chen et al. |
| 8,612,914 | B2 | 12/2013 | Sherlekar et al. |
| 8,647,893 | B1 | 2/2014 | Agarwal et al. |
| 8,661,392 | B2 | 2/2014 | Quandt et al. |
| 8,729,606 | B2 | 5/2014 | Becker et al. |
| 8,732,628 | B1 | 5/2014 | Wu et al. |
| 8,739,095 | B2 | 5/2014 | Cao et al. |
| 8,788,998 | B2 | 7/2014 | Hatamian et al. |
| 8,863,063 | B2 | 10/2014 | Becker et al. |
| 8,935,639 | B1 | 1/2015 | Tzeng |
| 8,949,749 | B2 | 2/2015 | Wang et al. |
| 8,959,472 | B1 | 2/2015 | Frederick, Jr. et al. |
| 9,007,060 | B2 | 4/2015 | Ausserlechner |
| 9,098,670 | B2 | 8/2015 | Song et al. |
| 2003/0084418 | A1 | 5/2003 | Regan |
| 2005/0198604 | A1 | 9/2005 | Yoshida et al. |
| 2006/0138464 | A1 | 6/2006 | Shimamura |
| 2007/0234243 | A1 | 10/2007 | Kyoh |
| 2007/0284618 | A1 | 12/2007 | Chang et al. |
| 2007/0300202 | A1 | 12/2007 | Uchida |
| 2008/0111158 | A1 | 5/2008 | Sherlekar et al. |
| 2008/0223502 | A1 | 9/2008 | Kawada |
| 2008/0263500 | A1 | 10/2008 | Kato et al. |
| 2009/0032898 | A1 | 2/2009 | Becker et al. |
| 2010/0155783 | A1 | 6/2010 | Law et al. |
| 2010/0187626 | A1 | 7/2010 | Becker |
| 2010/0196803 | A1 | 8/2010 | Lu et al. |
| 2010/0199253 | A1 | 8/2010 | Cheng et al. |
| 2011/0049575 | A1 | 3/2011 | Tanaka |
| 2011/0084312 | A1 | 4/2011 | Quandt et al. |
| 2011/0145775 | A1 | 6/2011 | Sano |
| 2011/0219341 | A1 | 9/2011 | Cao et al. |
| 2011/0296366 | A1 | 12/2011 | Arora et al. |
| 2012/0167021 | A1 | 6/2012 | Chen et al. |
| 2012/0241986 | A1 | 9/2012 | Sherlekar et al. |
| 2012/0249182 | A1 | 10/2012 | Sherlekar |
| 2013/0021026 | A1 | 1/2013 | Ausserlechner |
| 2013/0207199 | A1 | 8/2013 | Becker et al. |
| 2014/0065728 | A1 | 3/2014 | Agarwal et al. |
| 2014/0115546 | A1 | 4/2014 | Wang et al. |
| 2014/0181774 | A1 | 6/2014 | Hatamian et al. |
| 2014/0304671 | A1 | 10/2014 | Lu et al. |
| 2014/0380256 | A1 | 12/2014 | Song et al. |
| 2015/0084097 | A1* | 3/2015 | Jeon ............... H01L 27/11807 257/206 |
| 2015/0095857 | A1 | 4/2015 | Hsu et al. |
| 2016/0283634 | A1 | 9/2016 | Kim et al. |
| 2016/0300766 | A1* | 10/2016 | Kim ............... H01L 21/82347 |

FOREIGN PATENT DOCUMENTS

| | | |
|---|---|---|
| JP | H 11-3943 A | 1/1999 |
| JP | 2003529210 | 9/2003 |
| JP | 4349790 B2 | 10/2009 |
| JP | 2011124423 A | 6/2011 |
| JP | 201228479 A | 2/2012 |
| JP | 5151313 B2 | 2/2013 |
| JP | 201373139 A | 4/2013 |
| JP | 2014236116 A | 12/2014 |
| JP | 5758815 B2 | 8/2015 |
| KR | 100846089 B1 | 7/2008 |
| KR | 100935125 B1 | 1/2010 |
| KR | 1020150035405 A | 4/2015 |
| KR | 101532858 B1 | 6/2015 |

OTHER PUBLICATIONS

Office Action issued by United States Patent and Trademark Office, dated Feb. 10, 2017, in U.S. Appl. No. 15/094,586.

* cited by examiner

METHOD FOR MANUFACTURING A SEMICONDUCTOR DEVICE AND SEMICONDUCTOR DEVICE MANUFACTURED BY THE SAME

CROSS-REFERENCE TO RELATED APPLICATION

This application claims priority from Korean Patent Application Nos. 10-2015-0050150 and 10-2015-0146729, filed on Apr. 9, 2015 and Oct. 21, 2015, respectively, in the Korean Intellectual Property Office, the disclosures of which are hereby incorporated by reference in their entirety.

BACKGROUND

Apparatuses and methods consistent with the present disclosure relate to a semiconductor device and a method for manufacturing a semiconductor device and, more particularly, to a method for manufacturing a semiconductor device using a method for designing a layout of a semiconductor device and a semiconductor device manufactured by the same.

Semiconductor devices have been highly integrated to increase their capacities and to reduce their manufacture costs. In particular, the integration density of the semiconductor devices is a factor that directly affects the costs of the semiconductor devices. Since the integration density of the semiconductor devices is mainly determined by an area that a unit cell occupies, it may be advantageous to efficiently design layouts of the semiconductor devices.

When a layout of a semiconductor device is designed using a layout design tool, there is often a situation where the vicinity of a cell boundary is not routed. To make better use of this area, the layout may be redesigned, or an area of the layout may be increased. However, these methods may deteriorate the competitiveness of a semiconductor device as well as the efficiency of the layout design. Research is being conducted for a method of efficiently designing a layout, which is capable of improving the routing at the vicinity of the cell boundary.

SUMMARY

Exemplary embodiments provide a method for efficiently designing a layout of the vicinity of a cell boundary, a method for manufacturing a semiconductor device using the same and a semiconductor device manufactured by the same.

According to an aspect of an exemplary embodiment, there is provided a method for manufacturing a semiconductor device, the method including disposing pre-conductive lines for forming a first cell and a second cell, the first cell and the second cell being adjacent to each other in a first direction, a first conductive line of the pre-conductive lines of the first cell extending in a second direction perpendicular to the first direction and being adjacent to a boundary between the first and second cells; and disposing post-conductive lines for forming the first cell and the second cell, a second conductive line and a third conductive line among the post-conductive lines of the second cell extending in the first direction and being adjacent to the boundary, wherein the second conductive line and the third conductive line are respectively disposed on two non-adjacent tracks among a plurality of tracks that extend in the first direction, and wherein the first conductive line intersects at least one of the two non-adjacent tracks and at least one track disposed between the two non-adjacent tracks.

A distance between the second conductive line and the third conductive line may be greater than a width of at least one track.

The first conductive line may be spaced apart from one of the second and third conductive lines by a first reference distance or more.

The method may further include disposing a fourth conductive line on at least one track disposed between the two non-adjacent tracks, the fourth conductive line being disposed in the first cell, wherein the fourth conductive line overlaps the first conductive line when viewed from a plan view.

The method may further include disposing a fifth conductive line on at least one track disposed between the two non-adjacent tracks, the fifth conductive line being disposed in the second cell, and the fifth conductive line may be spaced apart from the fourth conductive line by a second reference distance greater than the first reference distance.

The first conductive line may have at least two hit-points at positions at which the first conductive line overlaps the plurality of tracks in a plan view, and the at least two hit-points may be capable of being connected to other conductive lines.

The pre-conductive lines may be formed by a patterning process using a first photomask, and the post-conductive lines may be formed by a patterning process using a second photomask different from the first photomask.

The method may further include before disposing the pre-conductive lines and the post-conductive lines, defining an active pattern on a substrate; forming a gate electrode intersecting the active pattern; and forming a source region and a drain region on the active pattern at both sides of the gate electrode, wherein at least one of the pre-conductive lines and the post-conductive lines is electrically connected to the gate electrode, and wherein at least another of the pre-conductive lines and the post-conductive lines is electrically connected to the source region or the drain region.

According to an aspect of another exemplary embodiments, there is provided a semiconductor device including a substrate including a PMOSFET region and an NMOSFET region; a plurality of pre-conductive lines that form a first cell and a second cell adjacent to each other in a first direction on the substrate, a first conductive line of the pre-conductive lines of the first cell extending in a second direction perpendicular to the first direction and being adjacent to a boundary between the first and second cells; and a plurality of post-conductive lines that form the first cell and the second cell, a second conductive line and a third conductive line among the post-conductive lines of the second cell extending in the first direction and being adjacent to the boundary, wherein the second conductive line and the third conductive line are respectively disposed on two non-adjacent tracks among a plurality of tracks that extend in the first direction, and wherein the first conductive line intersects at least one of the two non-adjacent tracks and at least one track disposed between the two non-adjacent tracks.

A distance between the second conductive line and the third conductive line may be greater than a width of at least one track.

The first conductive line may be spaced apart from one of the second and third conductive lines by a first reference distance or more.

The method may further include a fourth conductive line disposed on at least one track disposed between the two non-adjacent tracks, the fourth conductive line being disposed in the first cell, wherein the fourth conductive line overlaps the first conductive line when viewed from a plan view.

The method may further include a fifth conductive line disposed on at least one track disposed between the two non-adjacent tracks, the fifth conductive line being disposed in the second cell, wherein the fifth conductive line is spaced apart from the fourth conductive line by a second reference distance greater than the first reference distance.

The first conductive line may have at least two hit-points at positions at which the first conductive line overlaps the plurality of tracks in a plan view, and wherein the at least two hit-points are capable of being connected to other conductive lines.

The method may further include an active pattern defined on a substrate; a gate electrode intersecting the active pattern; and a source region and a drain region formed on the active pattern at both sides of the gate electrode, wherein at least one of the pre-conductive lines and the post-conductive lines is electrically connected to the gate electrode, and wherein at least another of the pre-conductive lines and the post-conductive lines is electrically connected to the source region or the drain region.

According to an aspect of another exemplary embodiment, there is provided a method for manufacturing a semiconductor device, the method including laying out a plurality of pre-conductive lines for forming a first cell and a second cell, the first cell and the second cell being adjacent to each other in a first direction and sharing a cell boundary, a first conductive line of the pre-conductive lines of the first cell extending in a second direction perpendicular to the first direction; initially laying out, in an initial layout, a plurality of post-conductive lines for forming the first cell and the second cell, a second conductive line and a third conductive line among the post-conductive lines of the second cell extending in the first direction and the first conductive line being separated from the second and third conductive lines by a separation distance across the cell boundary, and the second conductive line and the third conductive line being disposed on adjacent tracks among a plurality of tracks extending in the first direction; and rearranging the initial layout of one of the second and third conductive lines such that the second conductive line and the third conductive line are respectively disposed on two non-adjacent tracks among the plurality of tracks, wherein the first conductive line intersects at least one of the two non-adjacent tracks and at least one track disposed between the two non-adjacent tracks.

The initial layout may be rearranged while maintaining the separation distance between the first conductive line, and the second and third conductive lines.

The method may further include laying out a fourth conductive line on at least one track disposed between the two non-adjacent tracks, the fourth conductive line being disposed in the first cell and overlapping with the first conductive line.

The method may further include laying out a fifth conductive line on at least one track disposed between the two non-adjacent tracks, the fifth conductive line being disposed in the second cell, wherein the fifth conductive line is spaced apart from the fourth conductive line by a distance greater than the separation distance.

The initial layout may be rearranged without increasing the separation distance between the first conductive line, and the second and third conductive lines.

BRIEF DESCRIPTION OF THE DRAWINGS

The above and/or other exemplary aspects will become apparent and more readily appreciated from the following description of exemplary embodiments, taken in conjunction with the accompanying drawings in which.

DETAILED DESCRIPTION OF EXEMPLARY EMBODIMENTS

Figure 1:
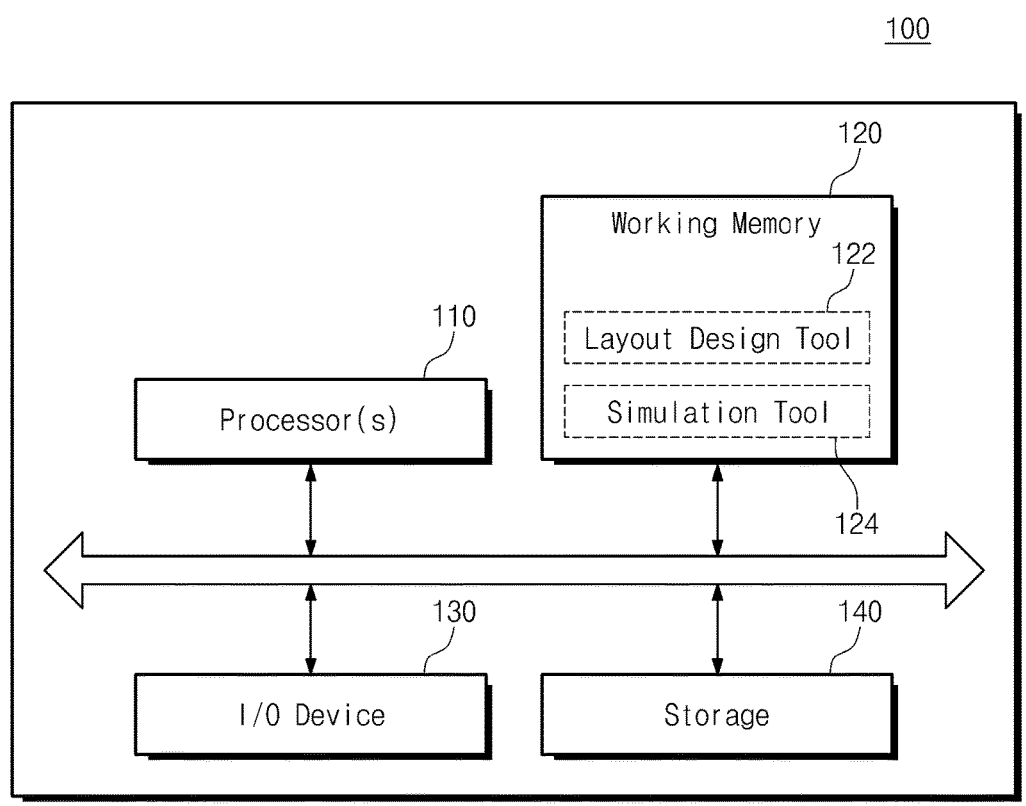
FIG. 1 is a schematic block diagram illustrating a computer system for designing a semiconductor device, according to an exemplary embodiment.

The above and other aspects, advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to illustrate the inventive concepts and let those skilled in the art know the category of the inventive concepts. In the drawings, exemplary embodiments are not limited to the specific examples provided herein and are exaggerated for clarity. The same reference numerals or the same reference designators denote the same elements throughout the specification.

It will be understood that when an element is referred to as being "connected", "coupled", or "adjacent" to another element, it may be directly connected or coupled to the other element or intervening elements may be present. As used herein, the term "and/or" includes any and all combinations of one or more of the associated listed items.

It will be also understood that although the terms "first", "second", "third" etc. may be used herein to describe various elements, these elements should not be limited by these terms. These terms are only used to distinguish one element from another element. Thus, a "first" element in some exemplary embodiments could be termed a "second" element in other exemplary embodiments without departing from the teachings of the present disclosure.

It will be understood that when an element such as a layer, region or substrate is referred to as being "beneath," "below," "above," "on," or "under" another element, it can be directly "beneath," "below," "above," "on," or "under" the other element or intervening elements may be present. In contrast, the term "directly" means that there are no intervening elements. Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to limit the inventive concept. As used herein, the singular terms "a," "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Exemplary embodiments will now be described more fully with reference to the accompanying drawings to convey the concepts of exemplary embodiments to those of ordinary skill in the art.

FIG. 1 is a schematic block diagram illustrating a computer system for designing a semiconductor device, according to an exemplary embodiment. Referring to FIG. 1, a computer system 100 may include at least one processor 110, a working memory 120, an input/output (I/O) device 130, and a storage 140. In some exemplary embodiments, the computer system 100 may be provided as a dedicated device for designing a layout. Moreover, the computer system 100 may be configured to drive various design and verification simulation programs.

The processor 110 may execute software (e.g., application programs, operating system (OS), device drivers) in the computer system 100. The processor 110 may execute an operating system (OS) loaded in the working memory 120. The processor 110 may execute various application programs to be driven based on the operating system. For example, the processor 110 may execute a layout design tool 122 loaded in the working memory 120.

The operating system or application programs may be loaded in the working memory 120. When the computer system 100 is booted up, an OS image stored in the storage 140 may be loaded to the working memory 120 according to a booting sequence. Overall input/output operations of the computer system 100 may be supported by the operating system. Likewise, application programs which are selected by a user or to provide a basic service may be loaded to the working memory 120. In some exemplary embodiments, the layout design tool 122 prepared for a layout design process according to some exemplary embodiments may also be loaded from the storage 140 to the working memory 120.

The layout design tool 122 may include a biasing function for changing shapes and positions of specific layout patterns, which are defined by a design rule. In addition, the layout design tool 122 may perform a design rule check (DRC) in the changed biasing data condition. The working memory 120 may include a volatile memory device such as a static random access memory (SRAM) device or a dynamic random access memory (DRAM) device. However, exemplary embodiments are not limited thereto. In some exemplary embodiments, the working memory 120 may include a non-volatile memory device such as a phase-change random access memory (PRAM) device, a magnetic random access memory (MRAM) device, a resistance random access memory (ReRAM) device, a ferroelectric random access memory (FRAM) device, and/or a flash memory device, etc. It should be noted that the type of memory device is not particularly limited.

A simulation tool 124 for performing an optical proximity correction (OPC) on designed layout data may be further loaded into the working memory 120.

The I/O device 130 may include various devices for receiving information from a designer and/or providing information to a designer. For example, the I/O device 130 may include a keyboard, a mouse, a monitor, and/or a touch screen, etc. The type of the I/O device 130 is not particularly limited. In some exemplary embodiments, a processing procedure and a processing result of the simulation tool 124 may be shown through the I/O device 130.

The storage 140 may be a storage medium of the computer system 100. The storage 140 may store the application programs, the OS image, and various kinds of data. For example, the storage 140 may include a solid state drive (SSD), an embedded multimedia card (eMMC), and/or a hard disk drive (HDD), etc. In some exemplary embodiments, the storage 140 may include a NAND flash memory device. However, exemplary embodiments of the inventive concepts are not limited to these devices. In certain exemplary embodiments, the storage 140 may include at least one of non-volatile memory devices such as a PRAM device, a MRAM device, a ReRAM device, a FRAM device, and a NOR flash memory device, or some combination thereof.

Figure 2:
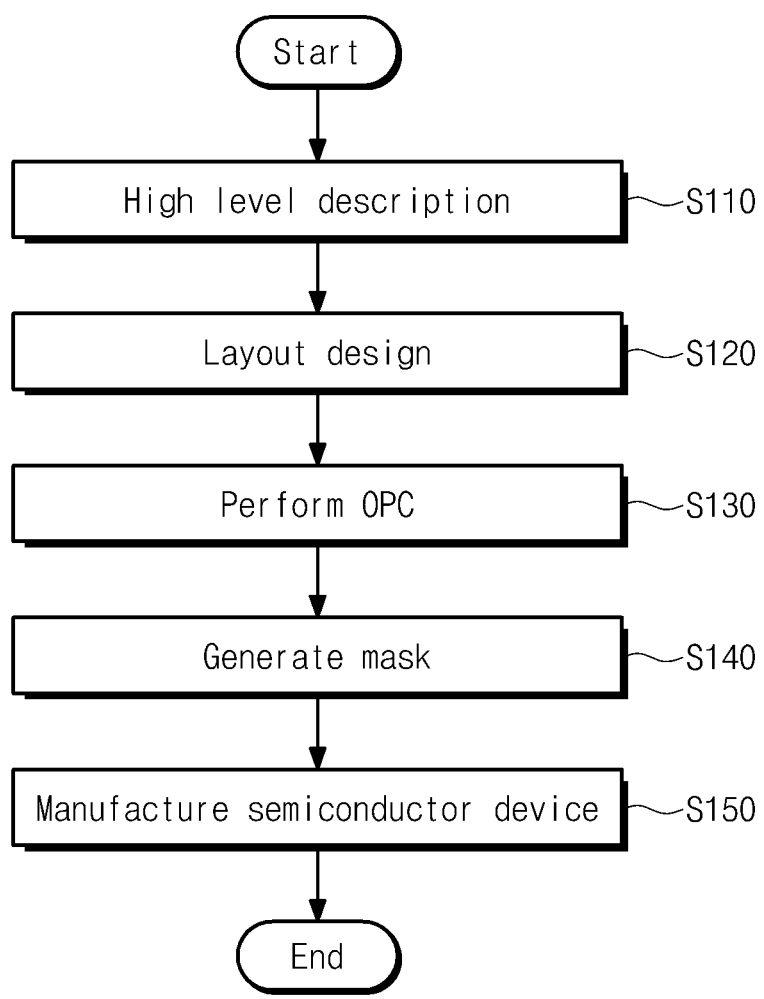
FIG. 2 is a flowchart illustrating a method for designing and manufacturing a semiconductor device, according to an exemplary embodiment.

FIG. 2 is a flow chart illustrating a method for designing and manufacturing a semiconductor device, according to an exemplary embodiment.

In operation S110, a high-level design process of a semiconductor integrated circuit may be performed using the computer system 100 of FIG. 1. The high-level design process may mean that an integrated circuit corresponding to a design target is described with a high-level language of a hardware description language (HDL). For example, the high-level language such as a C language may be used in the high-level design process. Circuits designed by the high-level design process may be specifically expressed using a register transfer level (RTL) coding and a simulation. In addition, codes generated by the RTL coding may be converted into a netlist, and the netlist may be synthesized to describe an entire semiconductor device. The synthesized schematic circuit may be verified by the simulation tool 124, and an adjustment process may be performed based on the verified result.

In operation S120, a layout design process may be performed to implement a logically completed semiconductor integrated circuit on a silicon substrate. For example, the layout design process may be performed based on the schematic circuit synthesized in the high-level design process or the netlist corresponding to the schematic circuit. The layout design process may include a routing process of placing and connecting various standard cells provided from a cell library, based on a prescribed design rule. A method of placing conductive lines at or around a boundary between two cells adjacent to each other may be provided in the layout design process according to some exemplary embodiments. This method will be described in detail later.

A cell library for expressing a specific gate-level circuit as a layout may be defined in the layout design tool. The layout may be prepared to define or describe shapes and sizes of patterns constituting transistors and conductive lines which will be actually formed on a silicon substrate. For example, layout patterns (e.g., PMOS, NMOS, N-WELL, gate electrodes, and conductive lines thereon) may be properly placed to actually form an inverter circuit on a silicon substrate. For placing the layout patterns, suitable one(s) of inverters previously defined in the cell library may be searched and selected. In addition, a routing process may be performed on selected and placed standard cells. These processes may be automatically or manually performed by the layout design tool.

After the routing process, a verification process may be performed on the layout to verify whether there is a portion violating the design rule. In some exemplary embodiments, the verification process may include a design rule check (DRC) for verifying whether the layout meets the design rule, an electrical rule check (ERC) for verifying whether there is an issue of electrical disconnection in the layout, and a layout vs schematic (LVS) for recognizing whether the layout is prepared to coincide with the gate-level netlist.

In operation S130, an optical proximity correction (OPC) process may be performed. The layout patterns obtained by the layout design process may be projected on a silicon substrate by a photolithography process. The OPC process denotes a technique for correcting an optical proximity effect occurring in the photolithography process. In other words, the OPC process may correct the optical proximity effect that may occur due to refraction or diffraction of light and/or a process side effect in in an exposure process using the layout patterns. The shapes and positions of the designed layout patterns may be slightly changed by the OPC process.

In operation S140, photomasks may be manufactured based on the layout changed by the OPC process. In general, the photomask may be manufactured by patterning a chromium layer provided on a glass substrate on the basis of the data of the layout patterns.

In operation S150, a semiconductor device may be manufactured using the manufactured photomasks. Various exposure processes and various etching processes may be repeatedly performed in the process of manufacturing the semiconductor device, and thus, the patterns defined by the layout design process may be sequentially formed on a silicon substrate.

Figure 3:
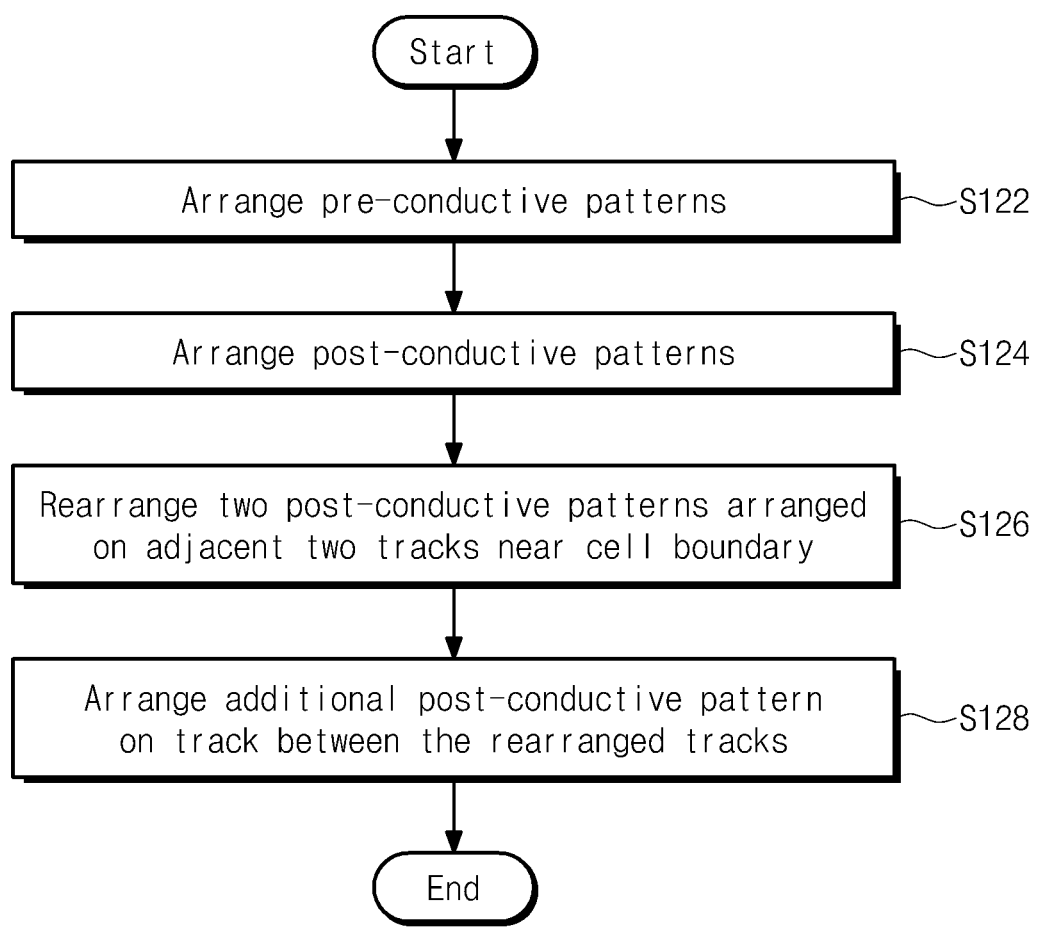
FIG. 3 is a flowchart illustrating a layout design operation of the designing and manufacturing method illustrated in FIG. 2.

FIG. 3 is a flow chart illustrating operation S120 illustrated in FIG. 2. FIGS. 4 to 10 are plan views illustrating layout patterns to explain a method for designing a layout, according to some exemplary embodiments.

Hereinafter, in terms used herein, 'a conductive pattern' may denote 'an imaginary conductive line' generated by the layout design tool and 'a conductive line' may denote 'a real conductive line' formed by a photolithography process using the conductive pattern.

Figure 4:
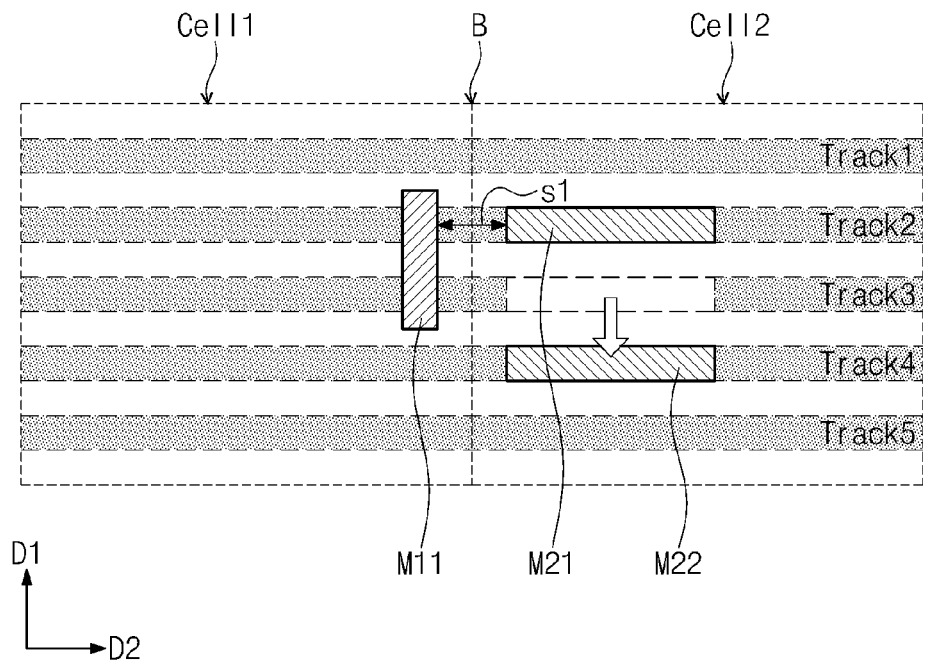
FIGS. 4 to 10 are plan views illustrating layout patterns to explain a method for designing a layout, according to some exemplary embodiments.

Referring to FIGS. 3 and 4, pre-conductive patterns may be arranged to form a first cell Cell1 and a second cell Cell2 in operation S122. The first cell Cell1 and the second cell Cell2 may be adjacent to each other in a second direction D2. In other words, the first cell Cell1 and the second cell Cell2 may be disposed on sides of a cell boundary B, respectively. For example, conductive patterns may include the pre-conductive patterns and post-conductive patterns. The pre-conductive patterns may be arranged before the post-conductive patterns are arranged. In other words, a photolithography process for forming pre-conductive lines may be performed before a photolithography process for forming post-conductive lines. The pre-conductive pattern M11 may be disposed adjacent to the cell boundary B and may extend in a first direction D1 perpendicular to the second direction D2. The pre-conductive pattern M11 may intersect two tracks adjacent to each other. In FIG. 4, for example, the pre-conductive pattern M11 intersects a track 2 and a track 3.

Referring to FIGS. 3 and 4, post-conductive patterns M21 and M22 for forming the first and second cells Cell1 and Cell2 may be arranged in operation S124. In FIG. 4, the post-conductive patterns M21 and M22 may be initially disposed on the track 2 and the track 3, respectively. The post-conductive patterns M21 and M22 may be disposed adjacent to the cell boundary B and may extend in the second direction D2 perpendicular to the first direction D1. The conductive patterns may be disposed on imaginary lines parallel to the second direction D2. The imaginary lines are defined as tracks in the present specification. For example, the tracks 1 to 5 may extend in the second direction D2. The imaginary lines may be predetermined. The tracks may be spaced apart from each other in the first direction D1. A distance between the tracks may be determined depending on a resolution of a photolithography process for forming the conductive lines corresponding to the conductive patterns generated by the layout design tool.

Referring to FIGS. 3 and 4, the conductive patterns that are adjacent to the cell boundary B and that are disposed initially on two tracks adjacent to each other may be rearranged in operation S126. For example, since the conductive patterns are rearranged, the conductive pattern (i.e., the post-conductive pattern) M22 previously disposed on the track 3 may be rearranged on the track 4.

Figure 5:
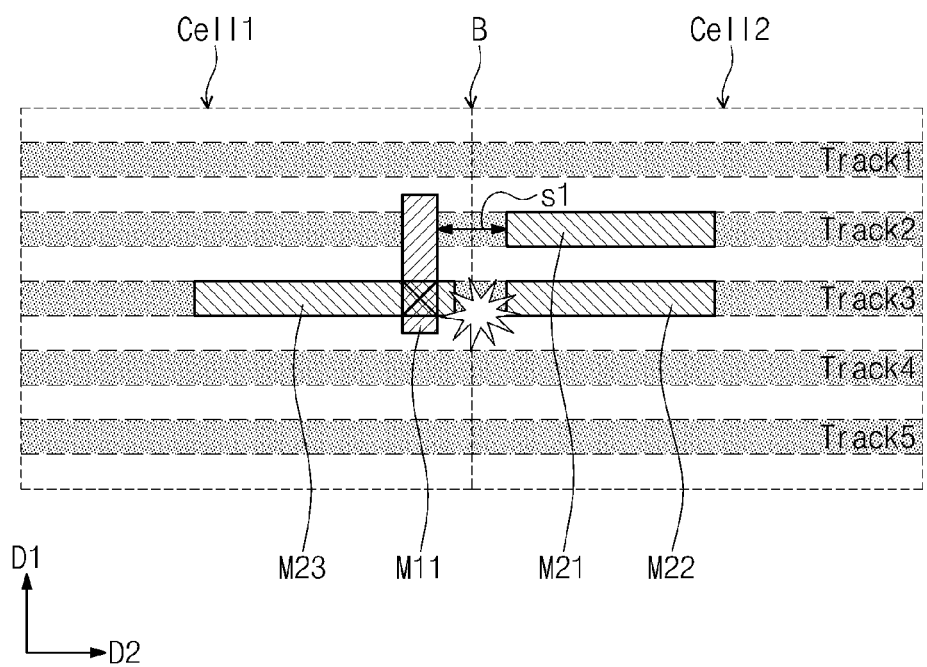

The rearrangement of the conductive patterns may be performed for the following reasons. Referring to FIG. 5, if the post-conductive patterns M21 and M22 are disposed on two tracks adjacent to each other, a problem may be caused in a routing process of connecting the conductive patterns. For example, when a conductive pattern M23 is arranged to connect the conductive pattern M11 to another conductive pattern, a routing problem between the conductive pattern M22 and the conductive pattern M23 may be caused by a short distance s1 between the conductive patterns adjacent to the cell boundary B. This problem may be caused by a resolution of a photolithography process defining fine patterns. Thus, by rearranging the conductive patterns M21 and M22, which are initially disposed on adjacent tracks, before the conductive pattern M23 for the routing process is arranged, the routing problem may be prevented.

Figure 6:
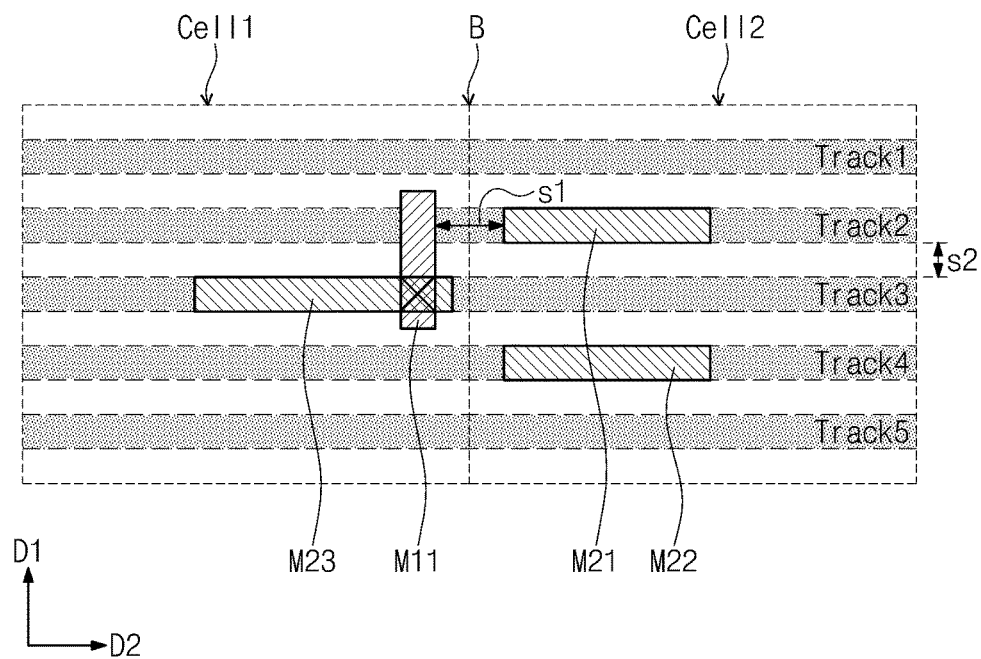

Referring to FIGS. 3 and 6, an additional post-conductive pattern M23 may be arranged in operation S128. For example, the conductive pattern M23 may be provided to perform the routing process of connecting the conductive pattern M11. In this case, the conductive pattern M11 may have two usable hit-points adjacent to each other. The hit-point may correspond to a point at which the conductive pattern M11 can come in contact with another conductive pattern by the routing process. The hit-points may be crossing points of the conductive pattern M11 and the tracks 2 and 3.

Even though two hit-points are usable, a routing limitation may be caused by the conductive pattern M21 if the conductive pattern M23 is arranged on the track 2. Thus, the conductive pattern M23 may be arranged on a track (i.e., the track 3) disposed between the rearranged two conductive patterns M21 and M22. In FIG. 6, the conductive pattern M23 may be arranged within the first cell Cell1. However, exemplary embodiments are not limited thereto. In certain exemplary embodiments, the conductive pattern M23 may further extend into the second cell Cell2 or another cell.

According to some exemplary embodiments, since the conductive patterns are not disposed on two tracks directly adjacent to each other, it is possible to prevent the routing problem that may be caused by the short distance s1 between the conductive patterns. However, in other exemplary embodiments, the conductive patterns may be disposed on two tracks directly adjacent to each other. This layout arrangement is illustrated in FIG. 7.

Figure 7:
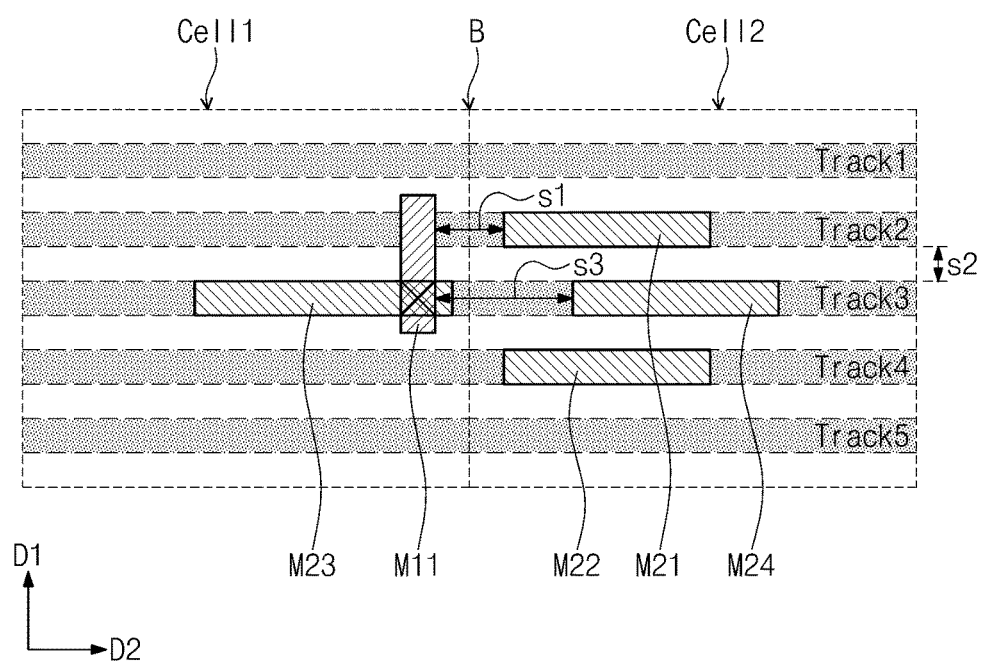
Figure 8:
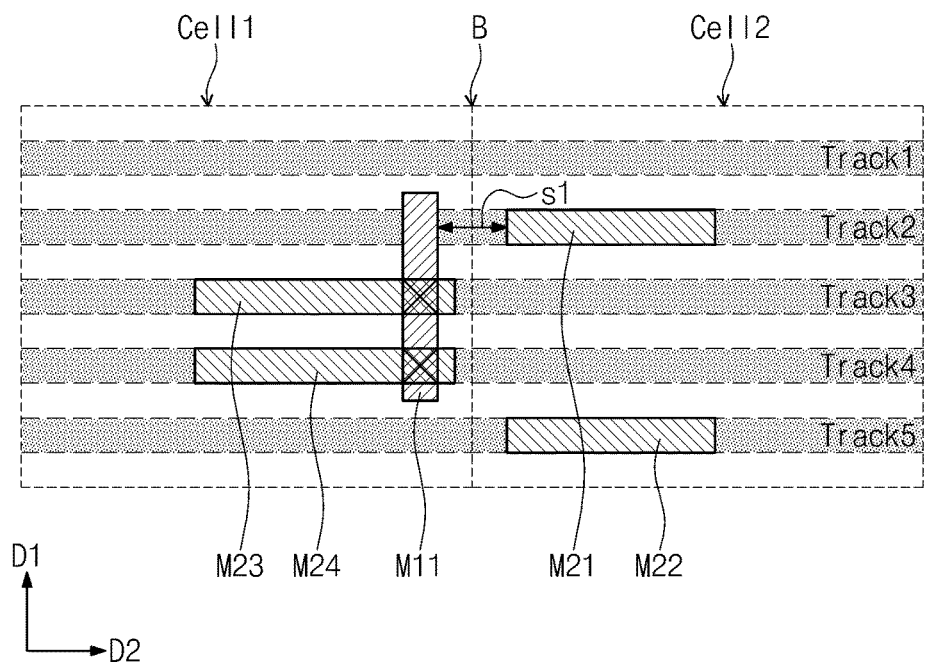

FIG. 7 is a plan view illustrating a modified exemplary embodiment of the layout illustrated in FIG. 6. A conductive pattern M24 may be further arranged between the two conductive patterns M21 and M22. In this case, the conductive pattern M24 may be spaced apart from the conductive pattern M23 by a distance s3 greater than the distance s1 such that a routing problem may be avoided. The distance s3 may be the minimum distance that does not cause the routing problem between the conductive pattern M23 and the conductive pattern M24.

In FIGS. 4 and 6, one track may be disposed between conductive patterns M21 and M22 adjacent to the cell boundary B when viewed from a plan view. Thus, a distance between the conductive patterns M21 and M22 may be greater than a width of the track. In some exemplary embodiments, the distance between the conductive patterns M21 and M22 may be equal to a sum of the width of the track and twice a distance s2 between the tracks. However, exemplary embodiments are not limited thereto. In certain exemplary embodiments, at least two tracks may be disposed between the conductive patterns M21 and M22 when viewed from a plan view. In this case, a distance between the conductive patterns M21 and M22 may be greater than a sum of the widths of at least two tracks. For example, in FIG. 8, two tracks are disposed between the conductive patterns M21 and M22. In this case, the conductive pattern M11 may have three usable hit-points (i.e., three points at which the conductive pattern M11 can come in contact with other conductive patterns during a routing process). The hit-points may be crossing points of the conductive pattern M11 and three tracks 2 to 4. Similarly to the exemplary embodiment illustrated in FIG. 6, even though the three hit-points are usable, the conductive patterns M23 and M24 may be respectively disposed on the tracks 3 and 4 due to the routing limitation caused by the conductive pattern M21.

Figure 9:
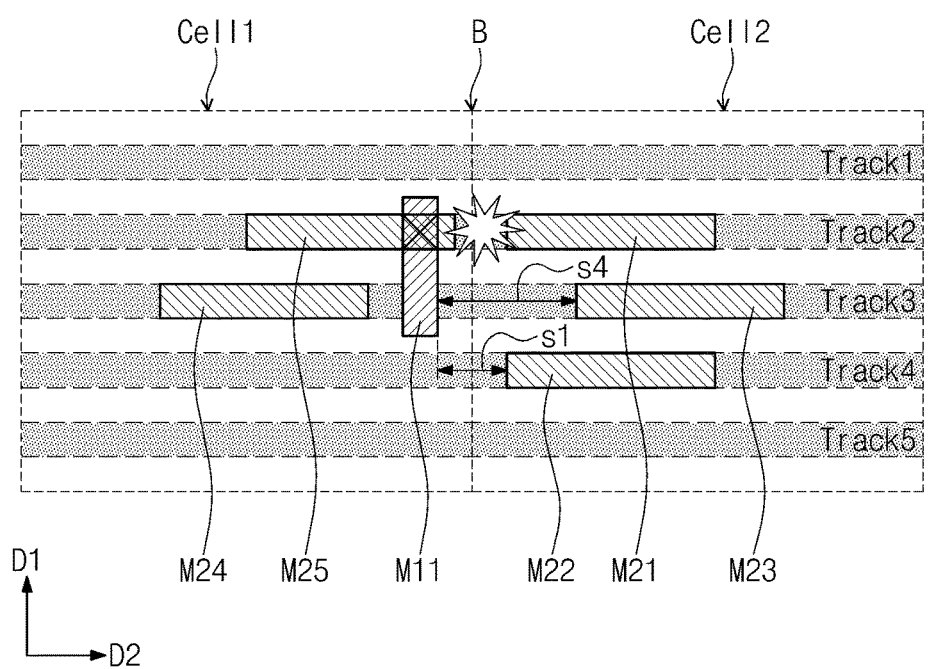
Figure 10:
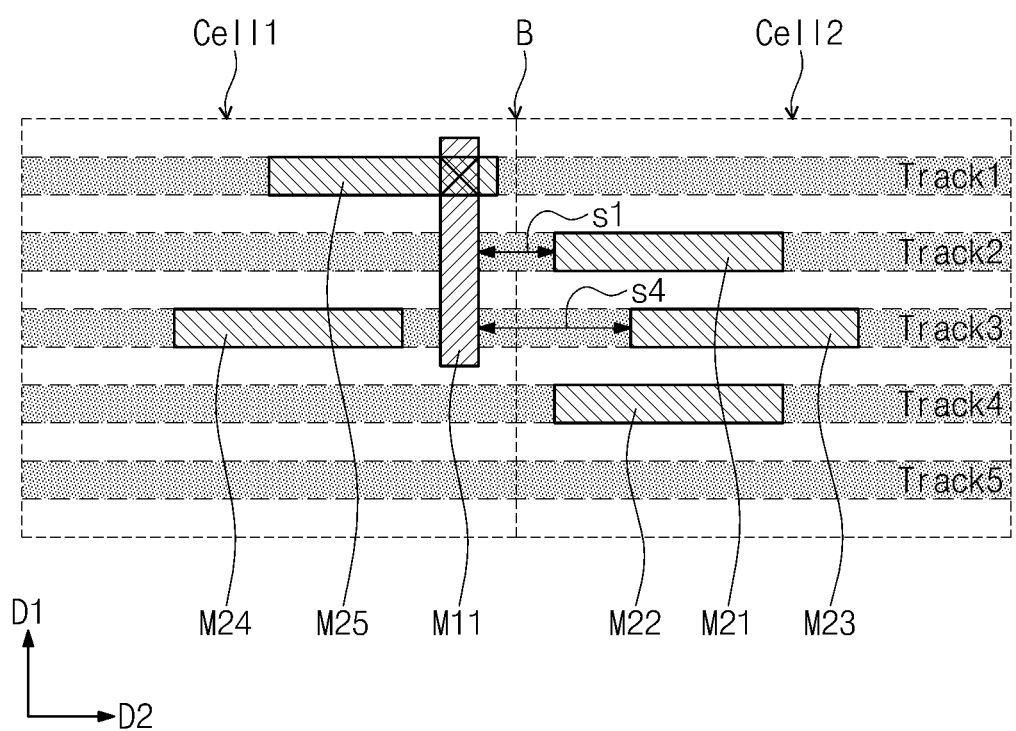
Figure 11A:
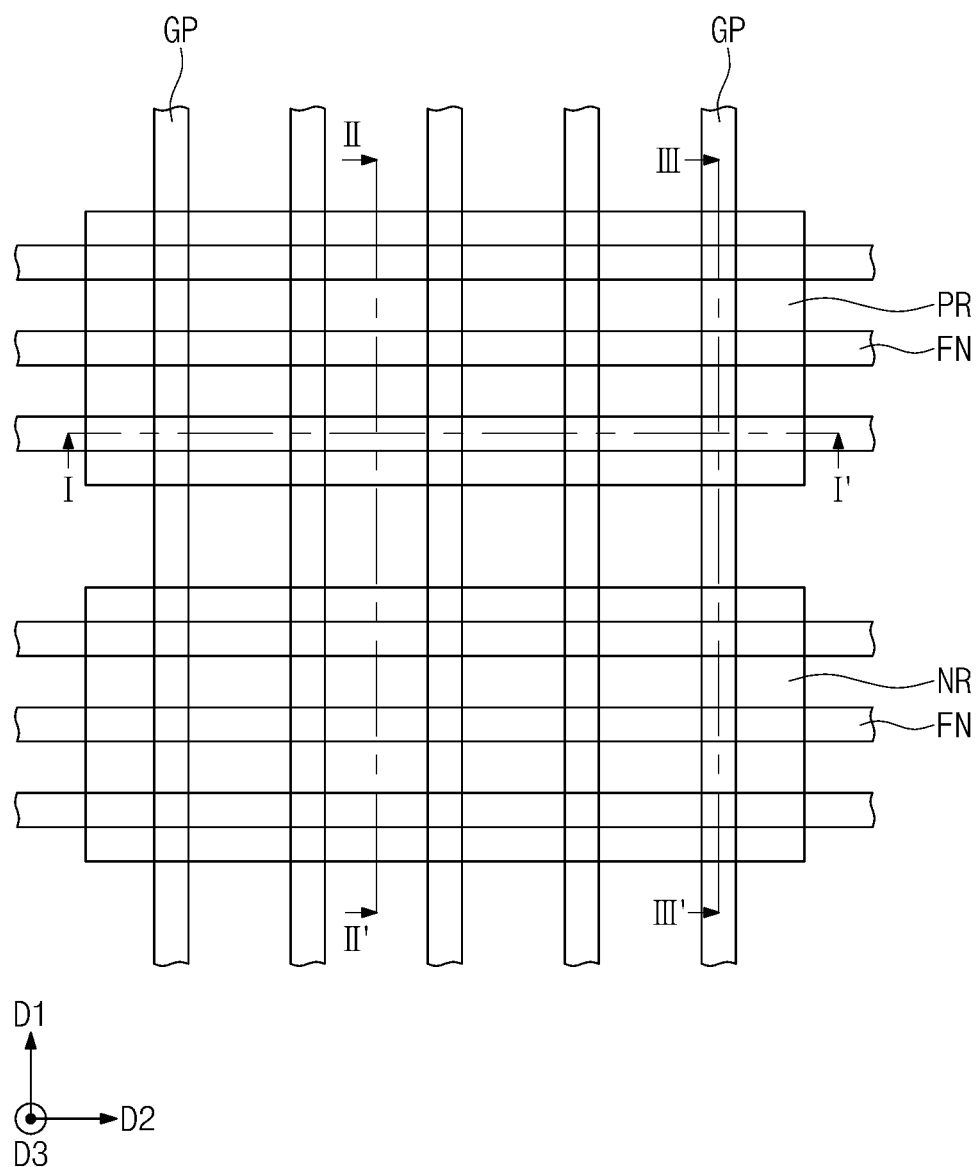
FIGS. 11A, 12A, 13A, and 14A are plan views illustrating a method for manufacturing a semiconductor device, according to some exemplary embodiments.
Figure 11B:
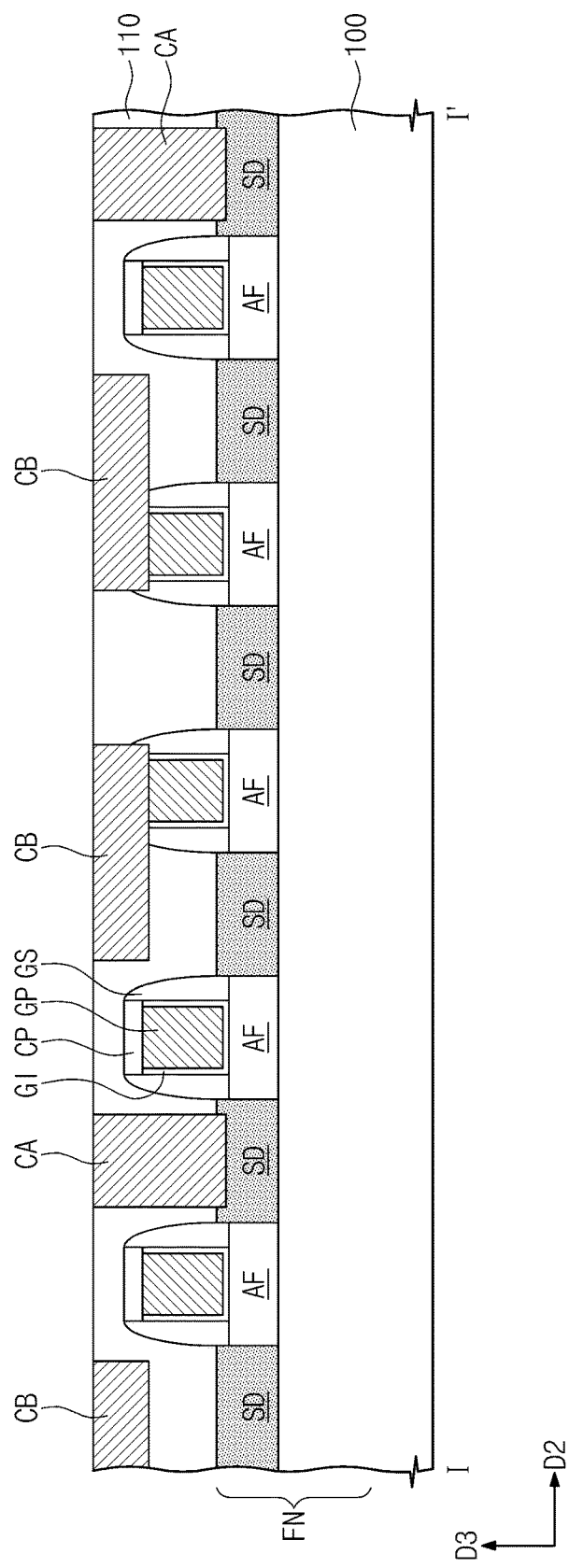
FIGS. 11B, 12B, 13B, and 14B are cross-sectional views taken along lines I-I' of FIGS. 11A, 12A, 13A, and 14A, respectively.
Figure 11C:
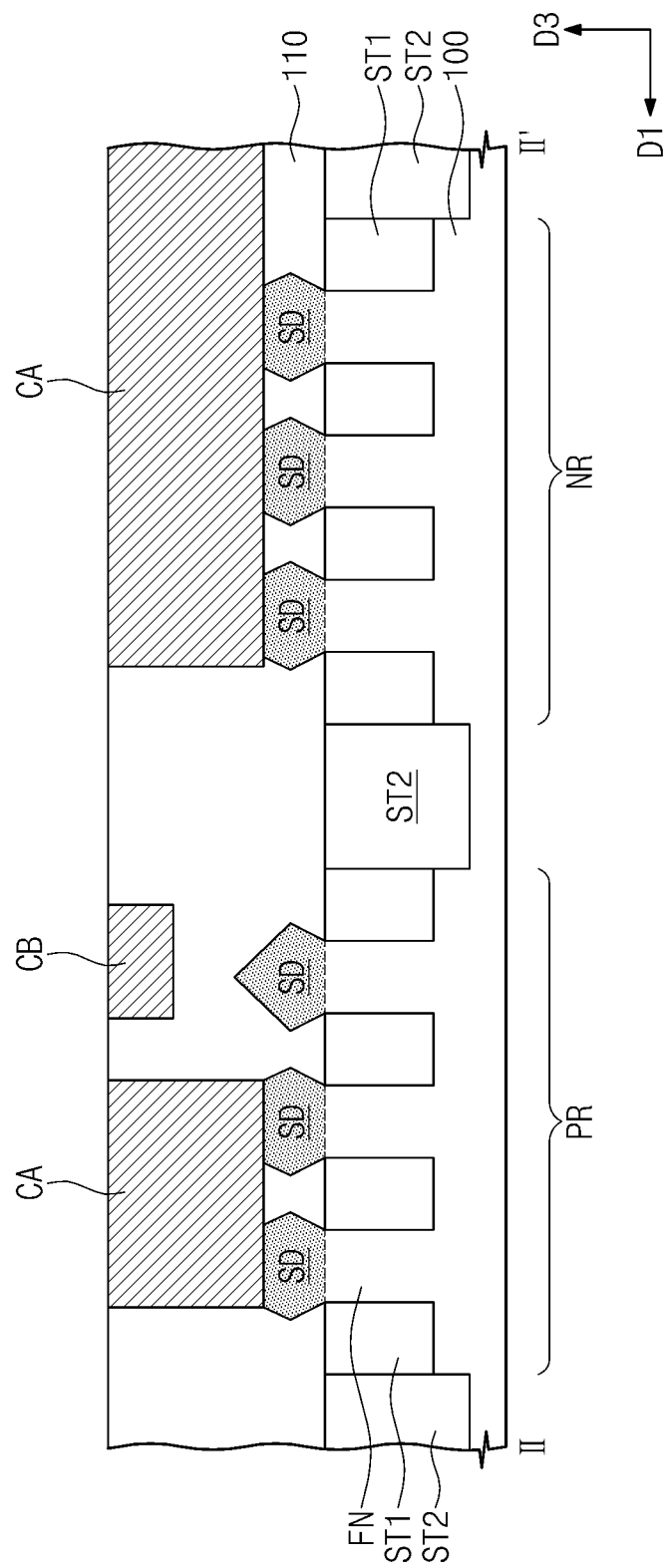
FIGS. 11C, 12C, 13C, and 14C are cross-sectional views taken along lines II-II' of FIGS. 11A, 12A, 13A, and 14A, respectively.
Figure 11D:
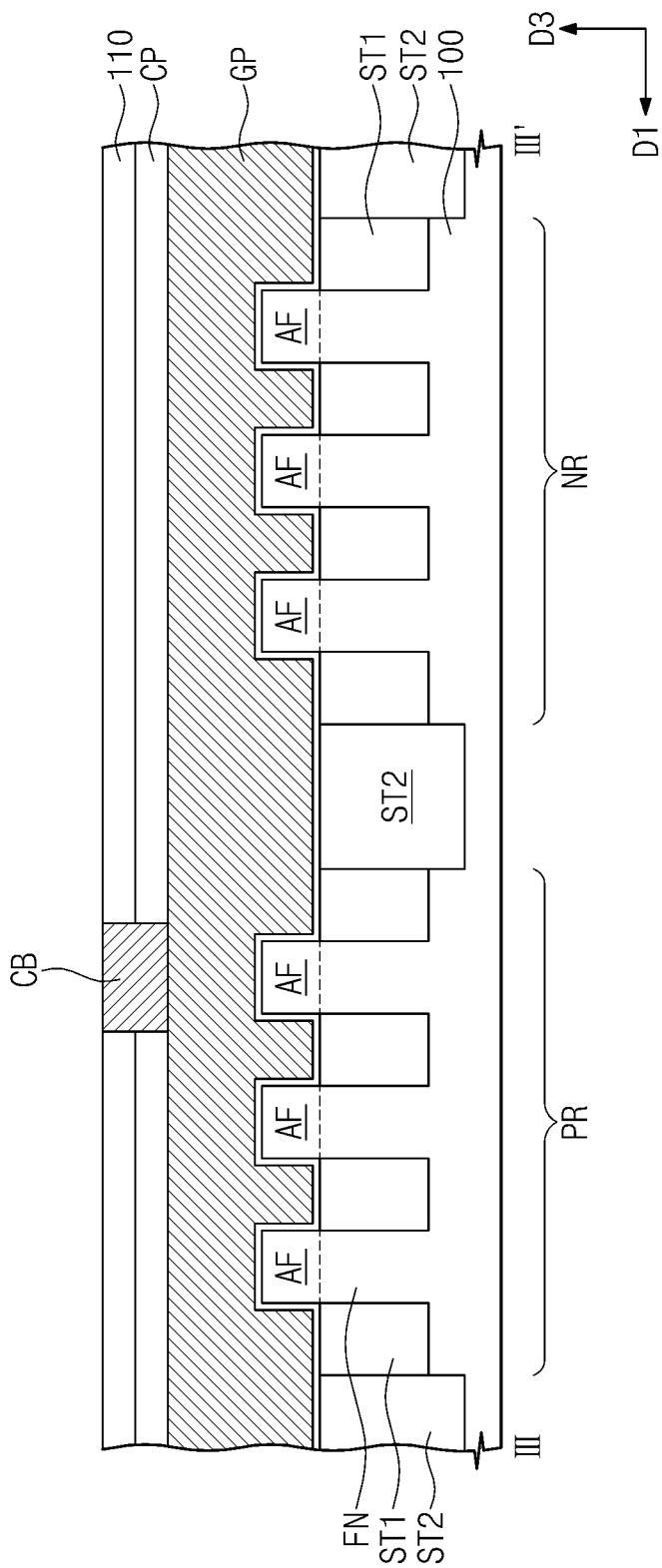
FIGS. 11D, 12D, 13D, and 14D are cross-sectional views taken along lines III-III' of FIGS. 11A, 12A, 13A, and 14A, respectively.
Figure 12A:
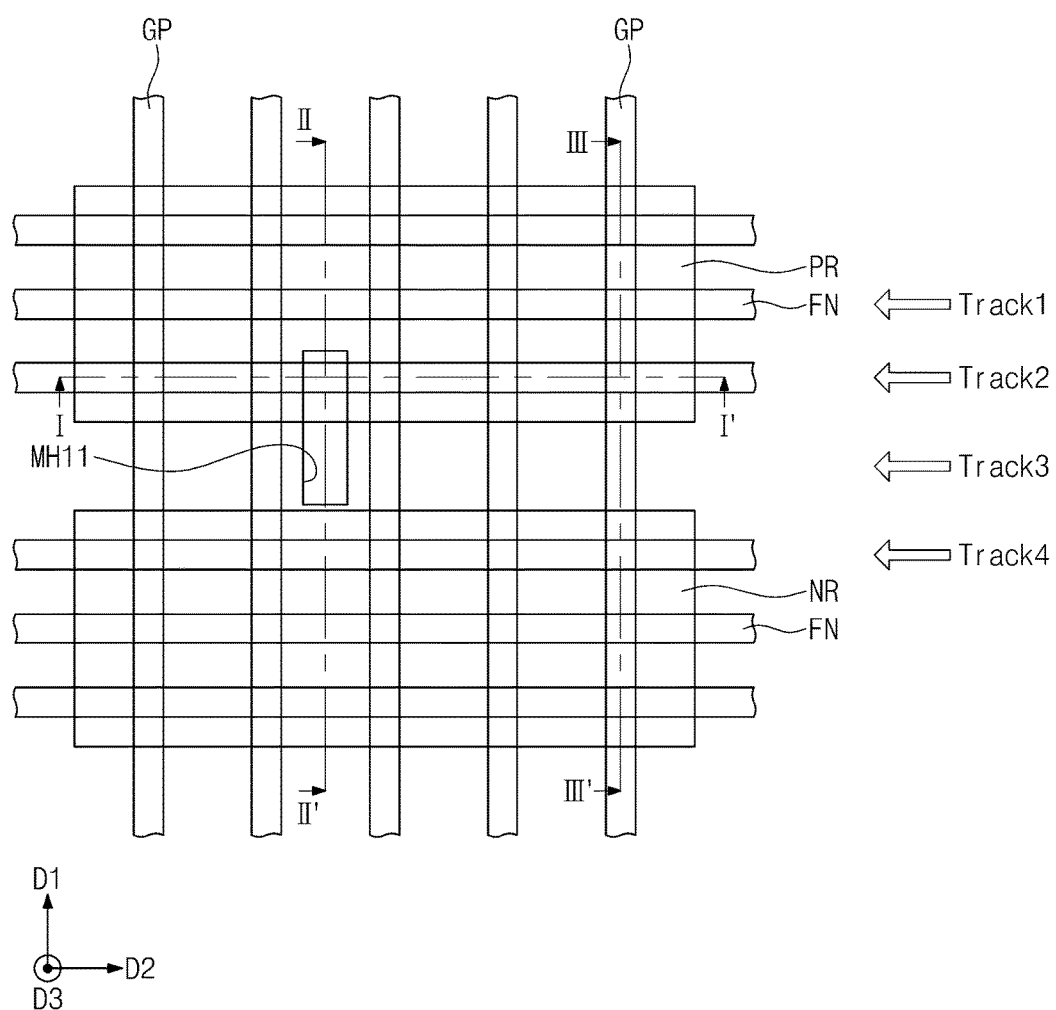
Figure 12B:
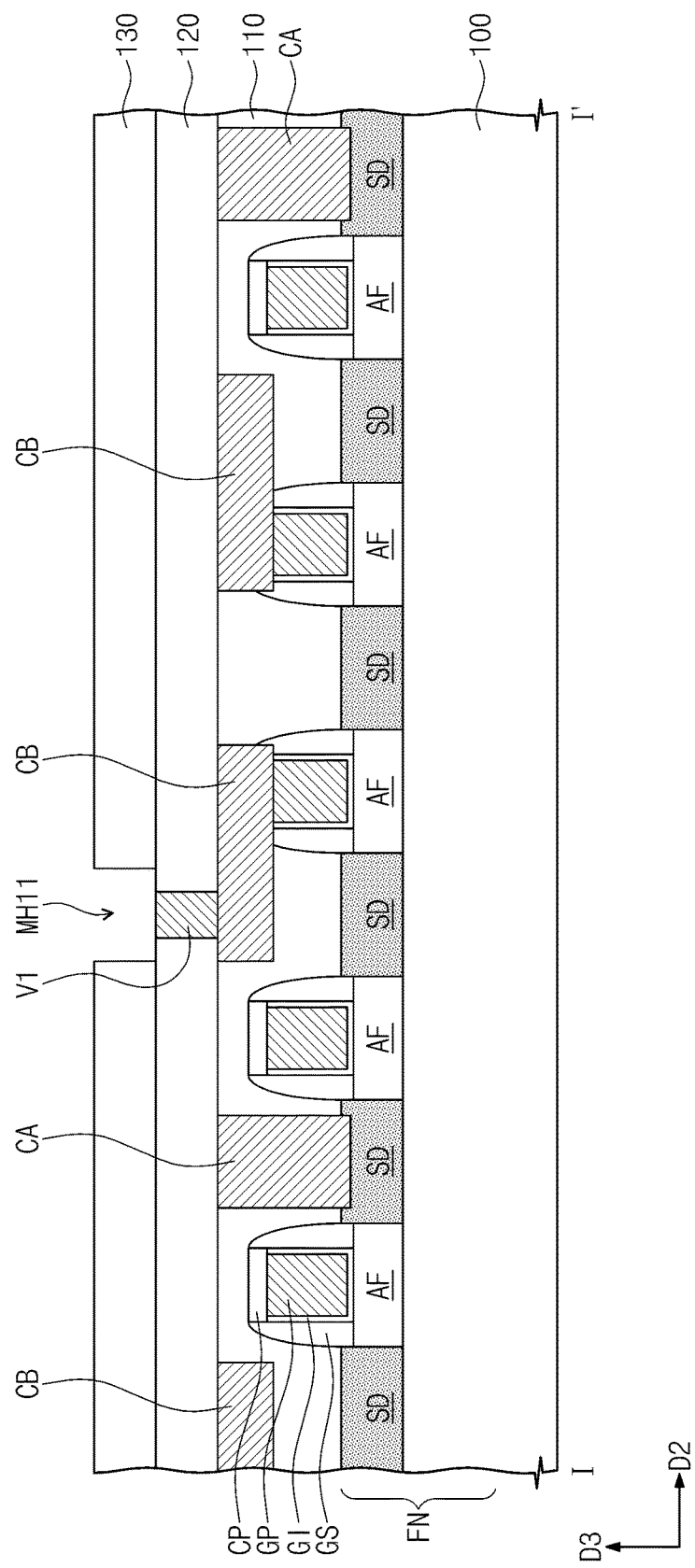
Figure 12C:
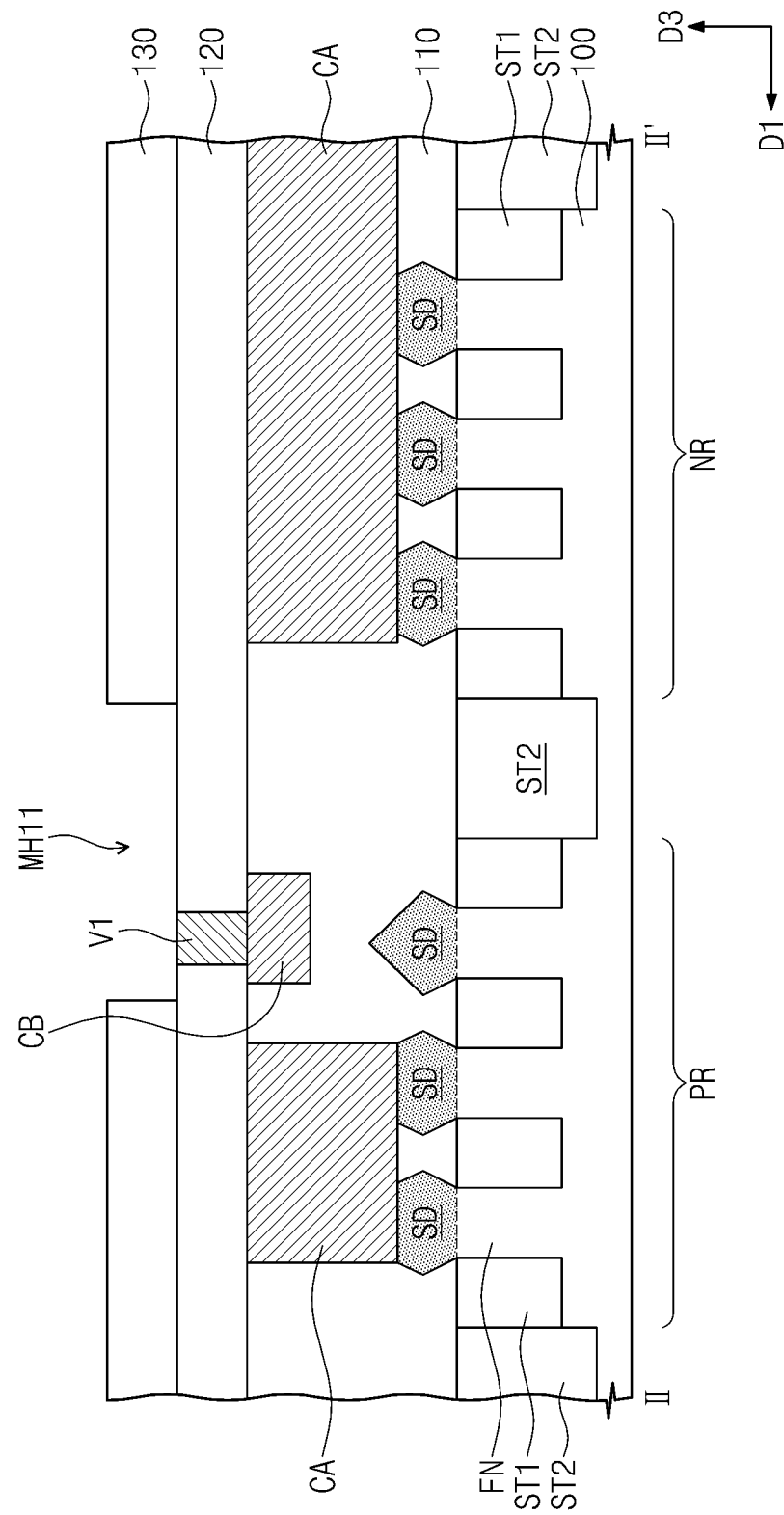
Figure 12D:
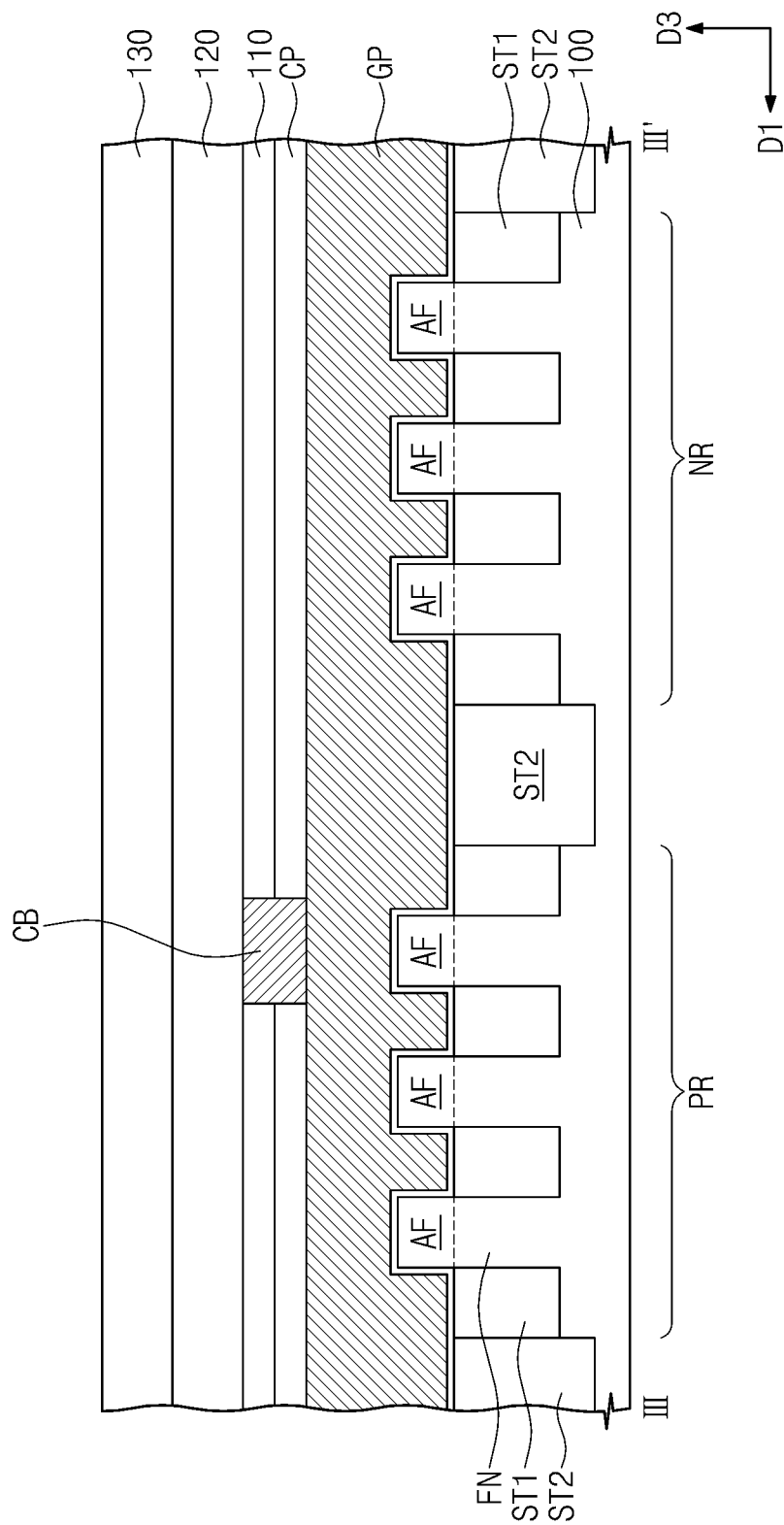
Figure 13A:
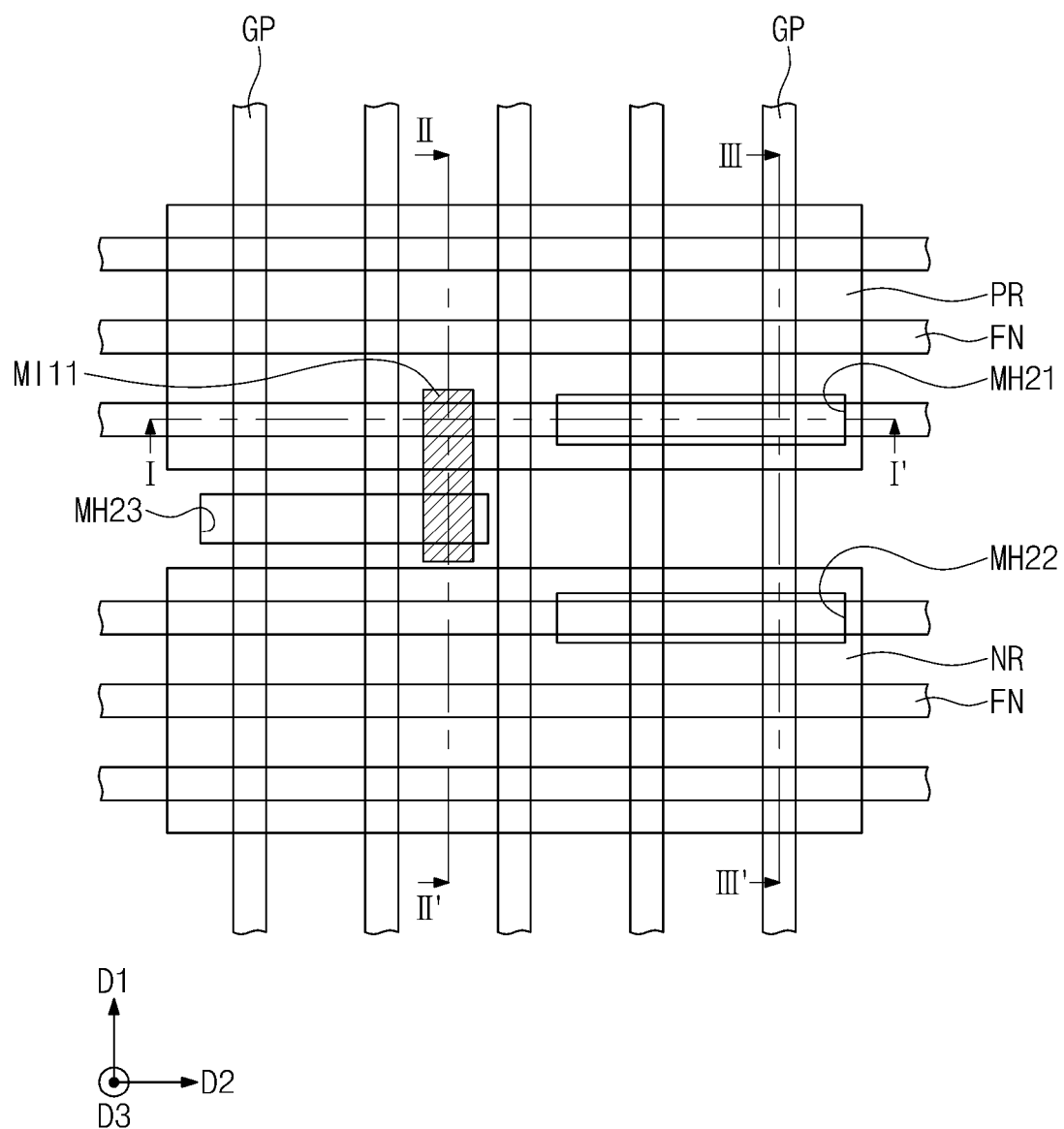
Figure 13B:
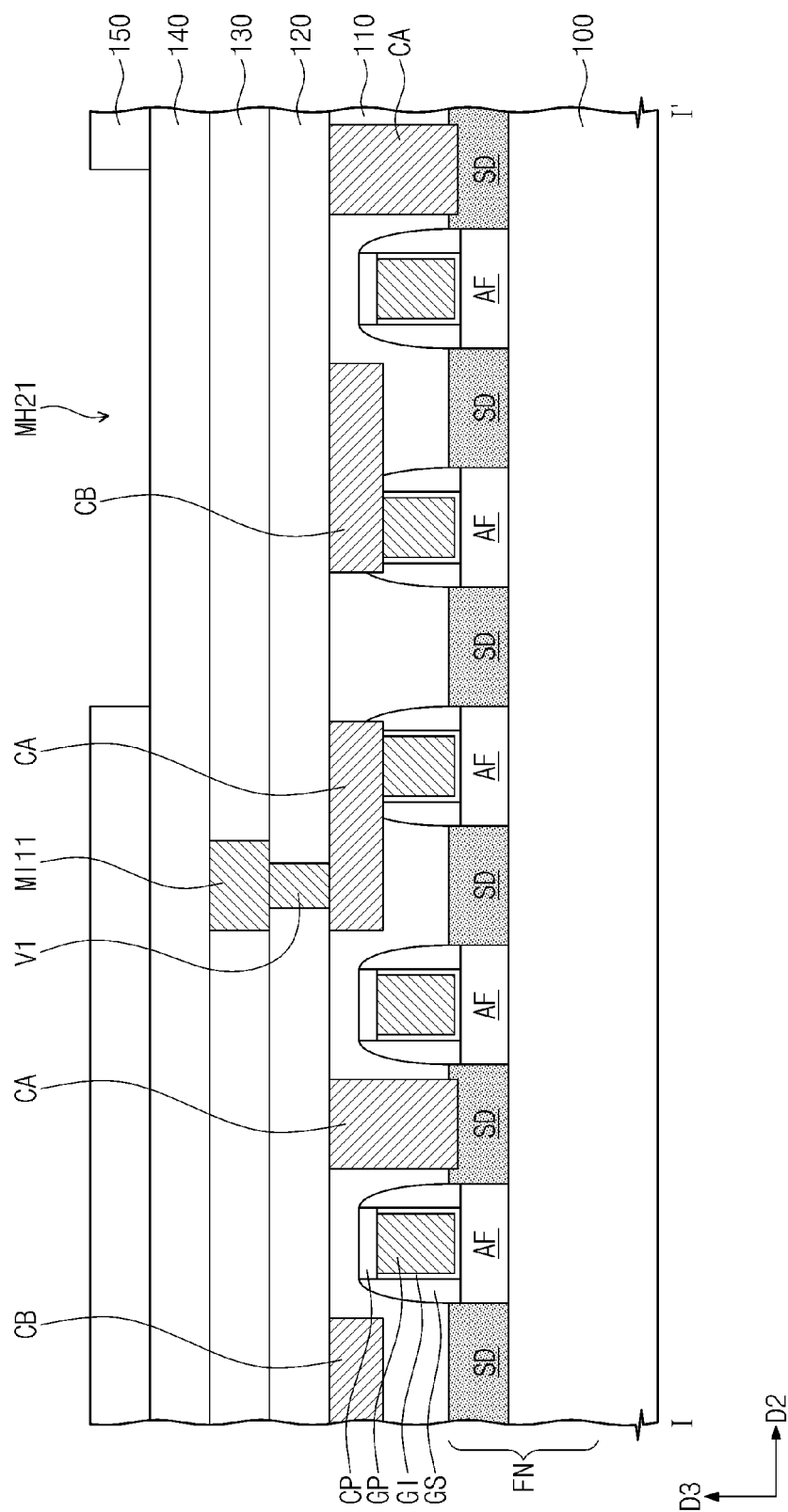
Figure 13C:
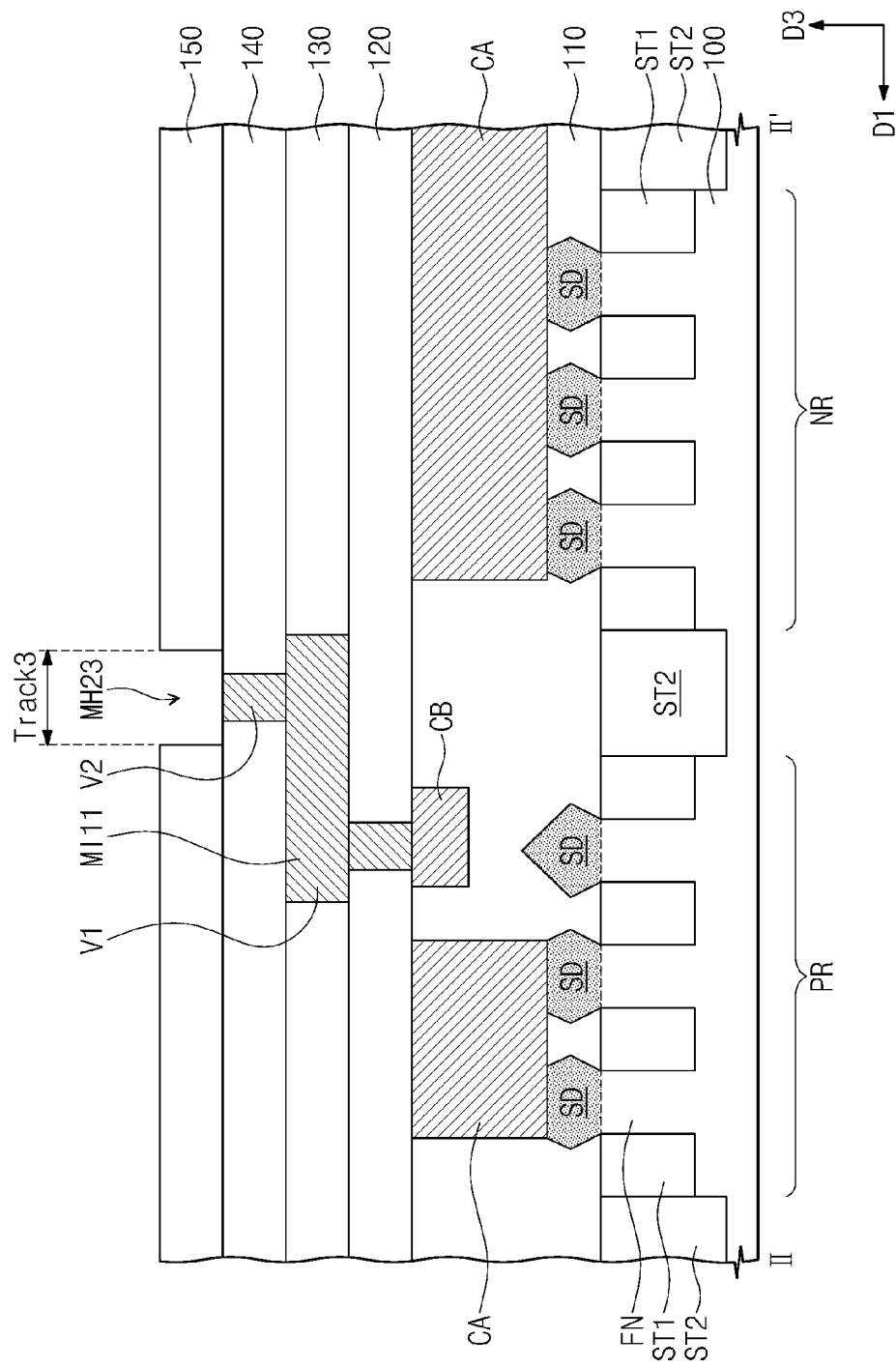
Figure 13D:
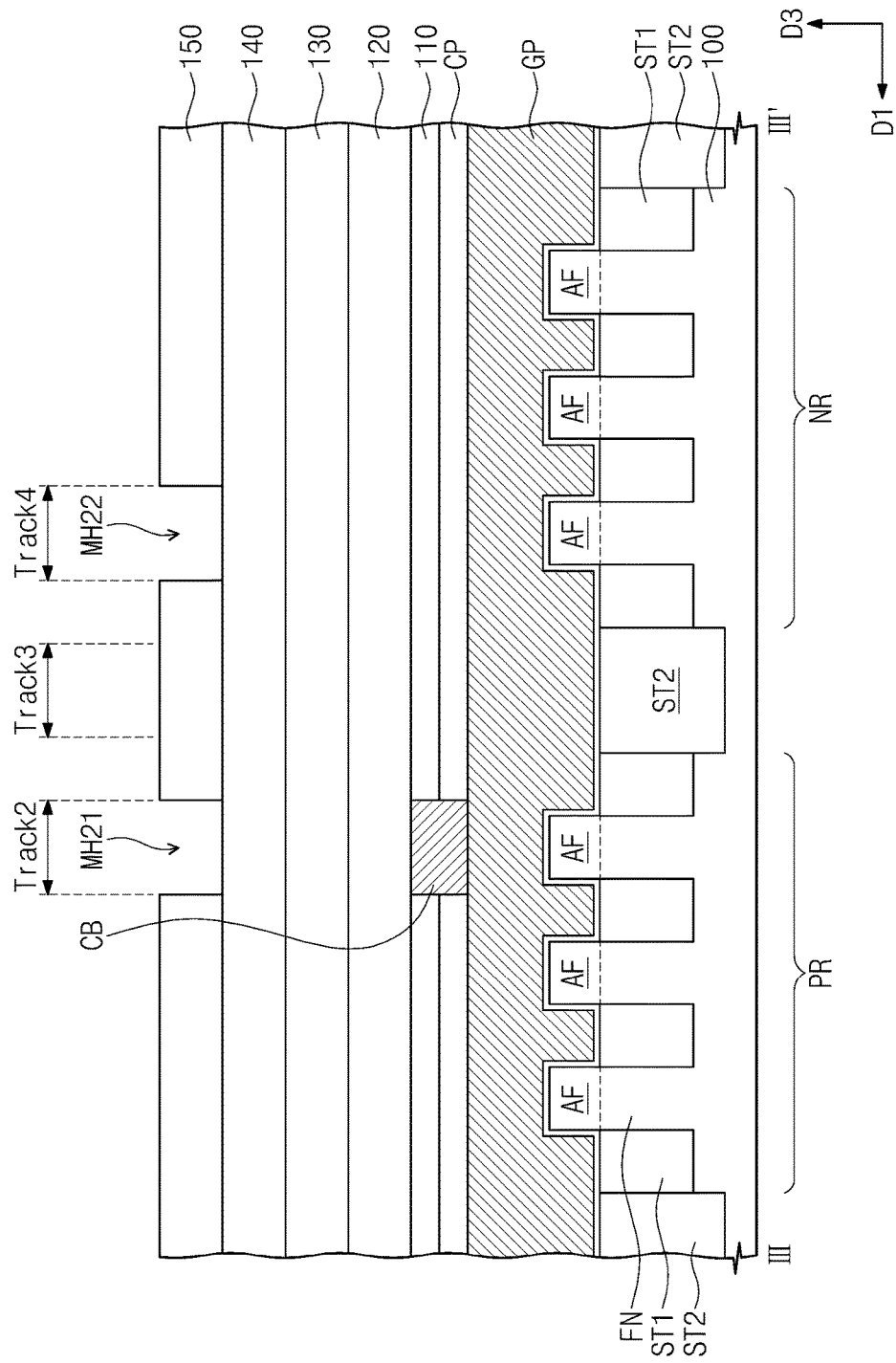
Figure 14A:
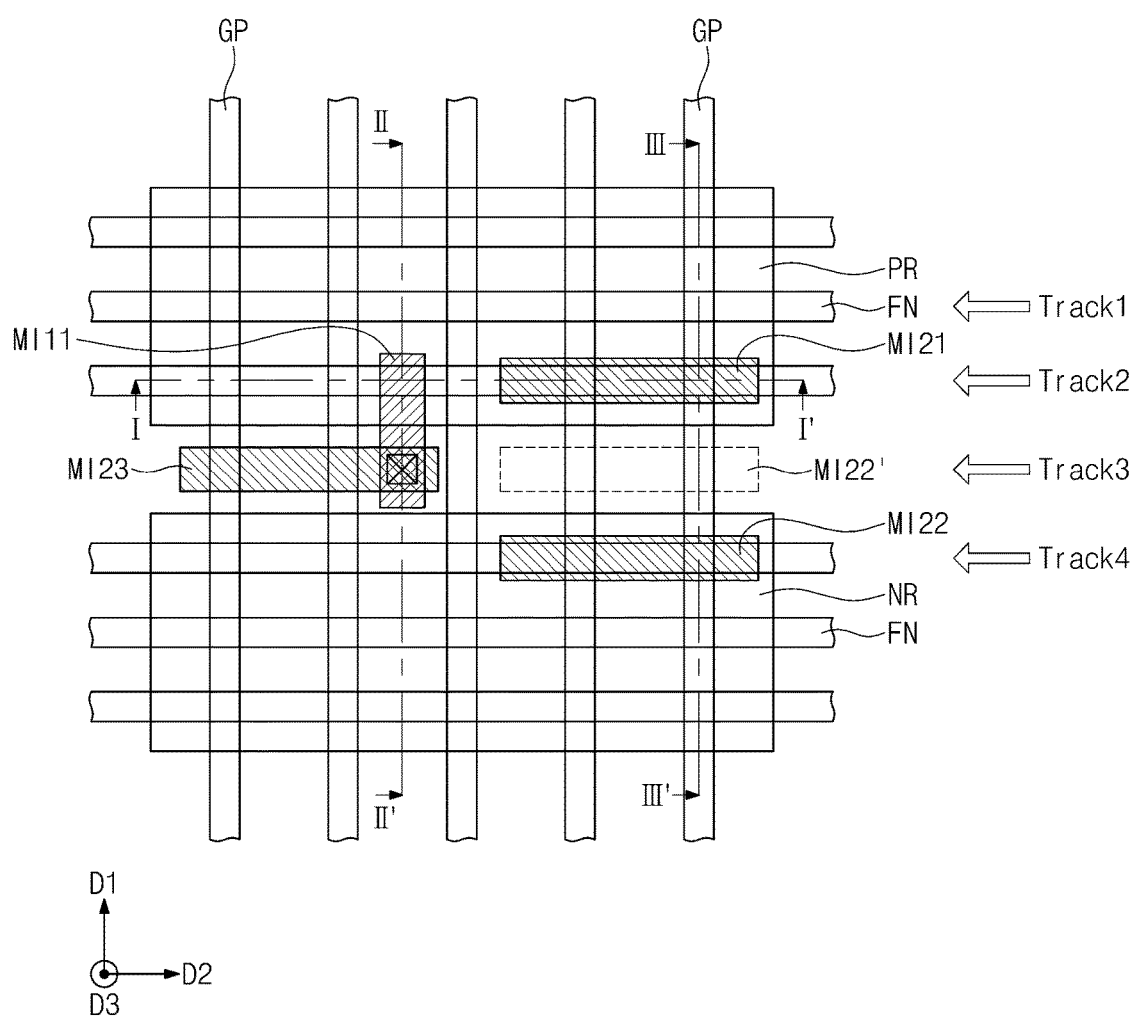
Figure 14B:
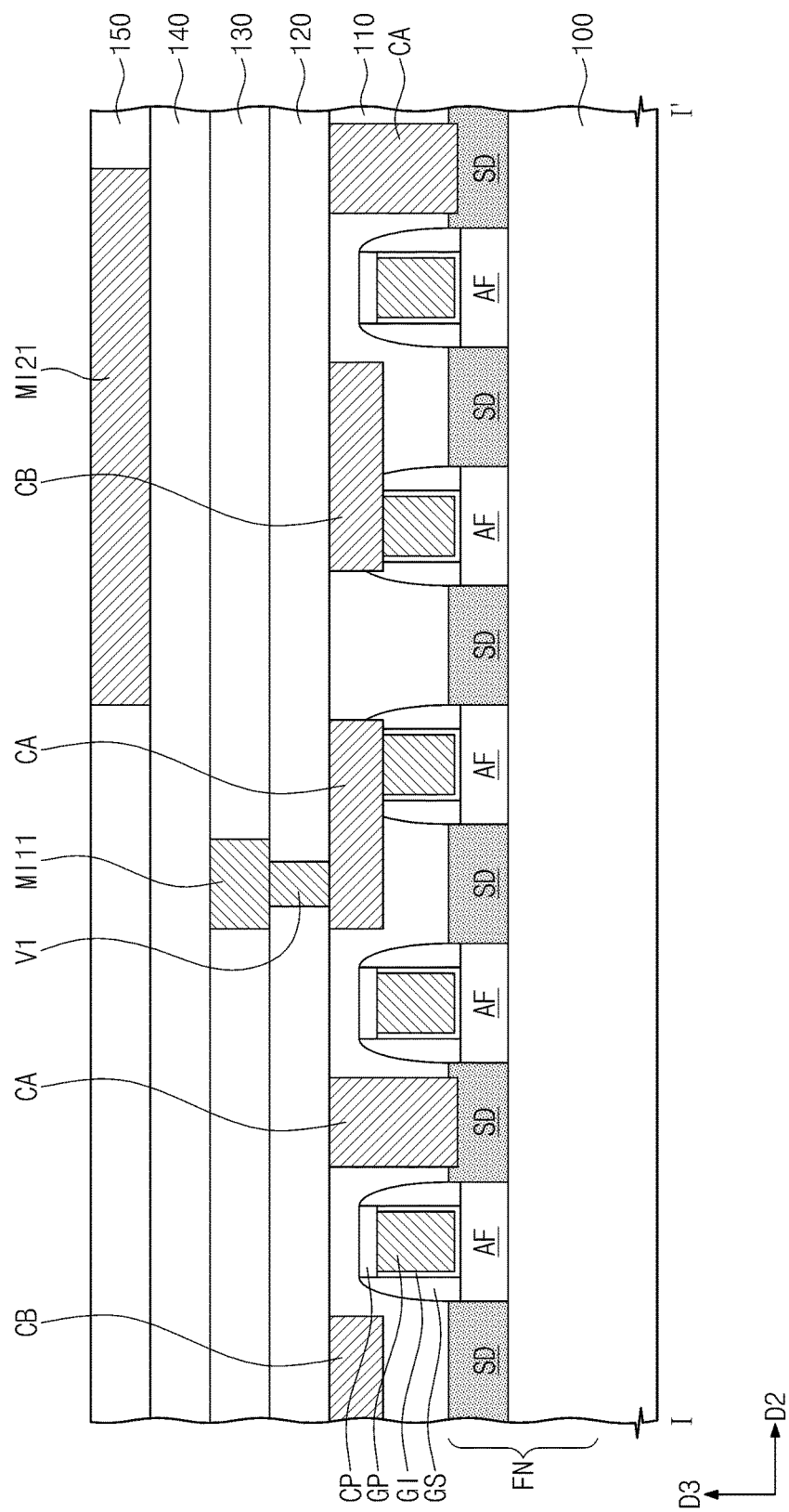
Figure 14C:
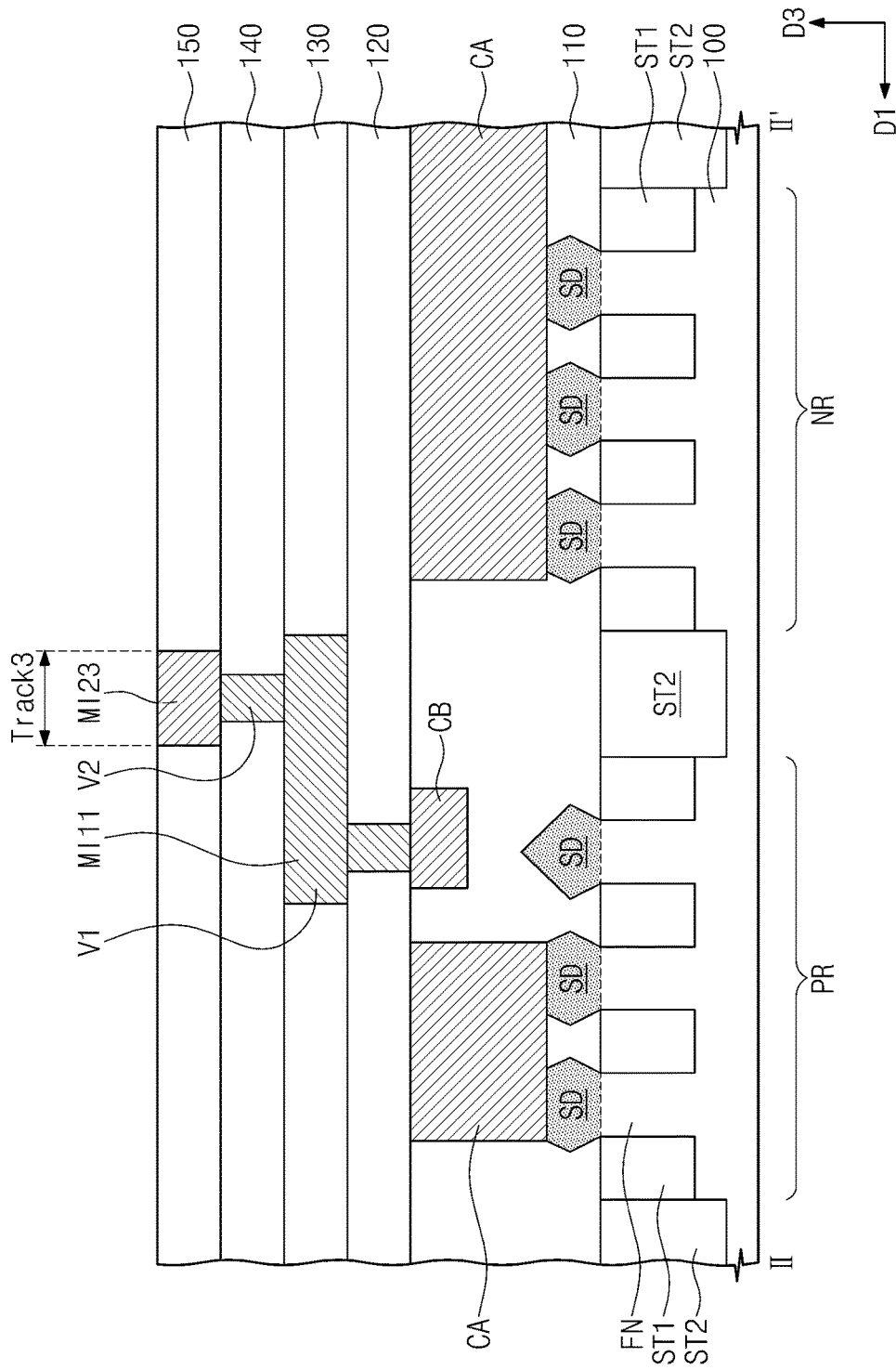
Figure 14D:
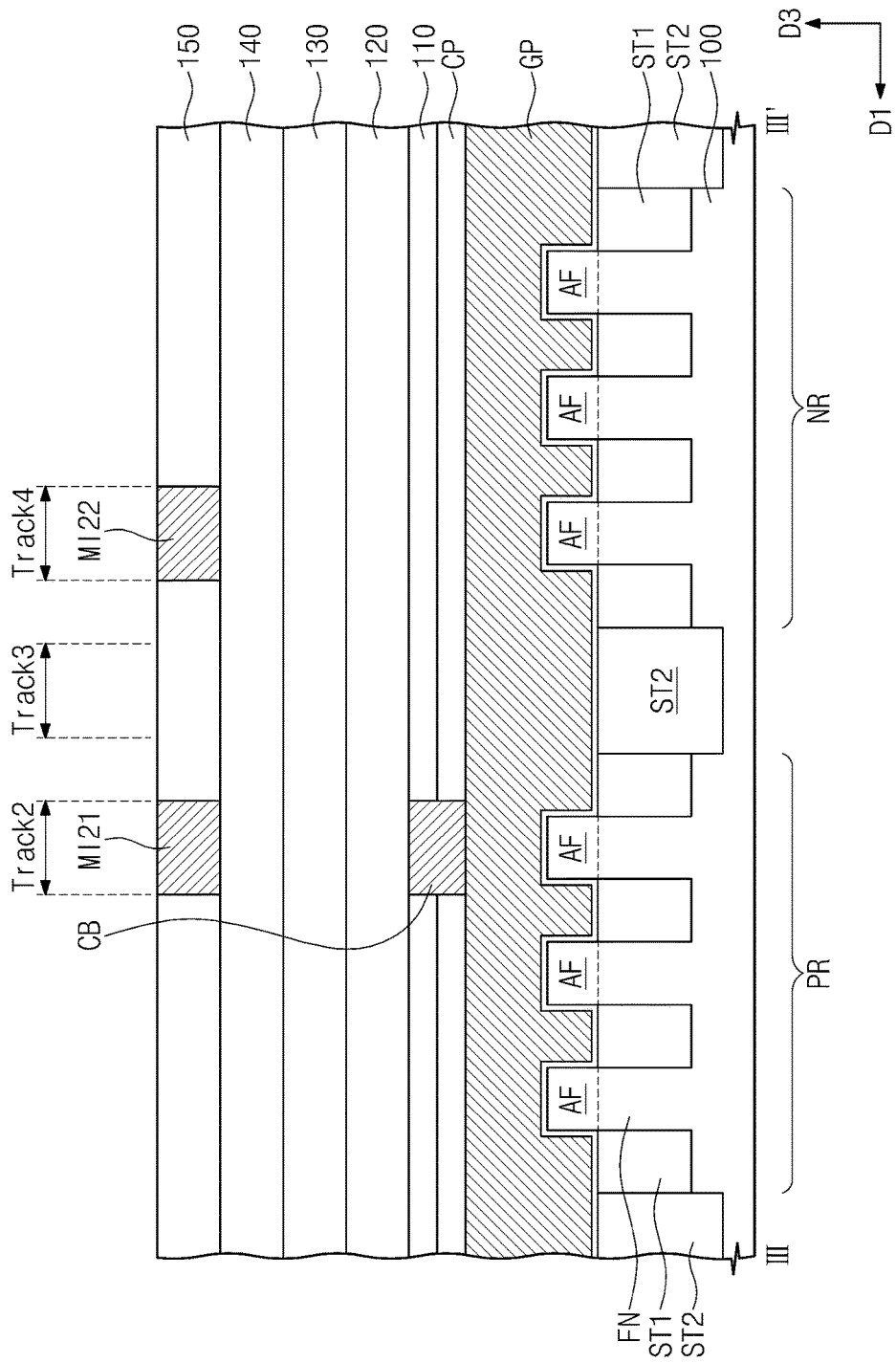

FIGS. 9 and 10 are plan views illustrating a modified exemplary embodiment of the layout illustrated in FIG. 6. Referring to FIG. 9, the conductive pattern M11 may be arranged initially adjacent to the cell boundary B. Thereafter, conductive patterns M21 to M25 may be arranged. The conductive patterns M21 and M22 may be respectively disposed on two non-adjacent tracks 2 and 4 on the basis of the design rule according to some exemplary embodiments. In addition, the conductive pattern M23 may be disposed on the track 3 and may be spaced apart from the conductive pattern M11 by a distance s4 that does not cause a routing problem. The conductive pattern M24 may be disposed on the track 3 and may be adjacent to the conductive pattern M11. Thus, the conductive pattern M11 may have two hit-points corresponding to crossing points of the conductive pattern M11 and two tracks 2 and 3.

However, a routing problem may be caused in the routing process of the conductive pattern M11 by the short distance s1 between the conductive pattern M11 and the conductive pattern M21 and a position of the conductive pattern M24. In this case, a design changing process may be performed such that the conductive pattern M11 extends onto the track 1, as illustrated in FIG. 10. Thus, the conductive pattern M25 may be (re)arranged on the track 1 so as to be connected to the conductive pattern M11. As a result, it is possible to prevent the routing problem.

A method for manufacturing a semiconductor device according to some exemplary embodiments will be described hereinafter. FIGS. 11A, 12A, 13A, and 14A are plan views illustrating a method for manufacturing a semiconductor device, according to some exemplary embodiments. FIGS. 11B, 12B, 13B, and 14B are cross-sectional views taken along lines I-I' of FIGS. 11A, 12A, 13A, and 14A, respectively. FIGS. 11C, 12C, 13C, and 14C are cross-sectional views taken along lines II-II' of FIGS. 11A, 12A, 13A, and 14A, respectively. FIGS. 11D, 12D, 13D, and 14D are cross-sectional views taken along lines III-III' of FIGS. 11A, 12A, 13A, and 14A, respectively.

Referring to FIGS. 11A, 11B, 11C, and 11D, a substrate 100 may be provided. For example, the substrate 100 may be a silicon substrate, a germanium substrate, or a silicon-on-insulator (SOI) substrate. First device isolation layers ST1 may be formed in the substrate 100 to define active patterns FN. Second device isolation layers ST2 may be formed in the substrate 100 to define a p-channel metal-oxide-semiconductor field-effect transistor (PMOSFET) region PR and an n-channel metal-oxide-semiconductor field-effect transistor (NMOSFET) region NR. The first and second device isolation layers ST1 and ST2 may be formed using a shallow-trench isolation (STI) technique. For example, the first and second device isolation layers ST1 and ST2 may include silicon oxide.

The first and second device isolation layers ST1 and ST2 may have depths in a direction opposite to a third direction D3. The third direction D3 may be a direction perpendicular to a top surface of the substrate 100. In some exemplary embodiments, the depths of the first device isolation layers ST1 may be shallower than those of the second device isolation layers ST2. In this case, the first device isolation layers ST1 may be formed by a process different from a process of forming the second device isolation layers ST2. In some exemplary embodiments, the first and second device isolation layers ST1 and ST2 may be formed at the same time and the depths of the first device isolation layers ST1 may be substantially equal to those of the second device isolation layers ST2.

Gate electrodes GP may be formed on the active patterns FN. The gate electrodes GP may extend in a first direction D1 to intersect the active patterns FN. The gate electrodes GP may be spaced apart from each other in a second direction D2. A gate insulating pattern GI may be formed under each of the gate electrodes GP, and gate spacers GS may be formed on sidewalls of each of the gate electrodes GP. In addition, a capping pattern CP may be formed to cover a top surface of each of the gate electrodes GP. A first interlayer insulating layer 110 may be formed to cover the gate electrodes GP.

The gate electrodes GP may include at least one of a semiconductor material doped with dopants, a metal, or a conductive metal nitride. The gate insulating pattern GI may include at least one of silicon oxide, silicon oxynitride, or a high-k dielectric material. The high-k dielectric material may have a dielectric constant higher than that of silicon oxide. Each of the capping pattern CP and the gate spacer GS may include at least one of silicon oxide, silicon nitride, or silicon oxynitride. The first interlayer insulating layer 110 may include at least one of a silicon oxide layer or a silicon oxynitride layer.

Source/drain regions SD may be formed on the active patterns FN at both sides of each of the gate electrodes GP. In some exemplary embodiments, the source/drain regions SD may be P-type or N-type dopant regions.

In some exemplary embodiments, the source/drain regions may be epitaxial patterns formed by a selective epitaxial growth (SEG) process. The source/drain regions SD may include a different semiconductor element from the substrate 100. For example, the source/drain regions SD may include a semiconductor element of which a lattice constant is greater or smaller than that of the semiconductor element of the substrate 100. Since the source/drain regions SD include a different semiconductor element from the substrate 100, the source/drain regions SD may apply compressive stress or tensile stress to channel regions AF disposed between the source/drain regions SD. In some exemplary embodiments, when the substrate 100 is a silicon substrate, the source/drain regions SD of the PMOSFET region PR may include silicon-germanium (embedded SiGe) or germanium. In this case, the source/drain regions SD of the PMOSFET region PR may apply the compressive stress to the channel regions AF of the PMOSFET region PR. In some exemplary embodiments, when the substrate 100 is a silicon substrate, the source/drain regions SD of the NMOSFET region NR may include silicon carbide (SiC). In this case, the source/drain regions SD of the NMOSFET region NR may apply the tensile stress to the channel regions AF of the NMOSFET region NR. As a result, the mobility of carriers generated in the channel regions AF may be improved.

Source/drain contacts CA may be formed between the gate electrodes GP. The source/drain contacts CA may be electrically connected to the source/drain regions SD. The source/drain contacts CA may be provided in the first interlayer insulating layer 110. At least one of the source/drain contacts CA may connect the source/drain regions SD arranged along the first direction D1 to each other.

Gate contacts CB may be formed in an upper portion of the first interlayer insulating layer 110. Each of the gate contacts CB may penetrate the capping pattern CP so as to be directly connected to the gate electrode GP. Bottom surfaces of the gate contacts CB may be disposed at a higher level than bottom surfaces of the source/drain contacts CA. In addition, the bottom surfaces of the gate contacts CB may be disposed at a higher level than top surfaces of the source/drain regions SD.

Referring to FIGS. 12A, 12B, 12C, and 12D, a second interlayer insulating layer 120 may be formed on the first interlayer insulating layer 110. A first via V1 may be formed in the second interlayer insulating layer 120. The first via V1 may be electrically connected to the gate contact CB. A third interlayer insulating layer 130 may be formed on the second interlayer insulating layer 120.

A first photolithography process using a first photomask and an etching process may be performed to form a conductive line hole MH11 penetrating the third interlayer insulating layer 130. The first photomask may be manufactured using a first pattern group including the conductive pattern M11 described with reference to FIGS. 4 to 8. For example, the first pattern group may include the pre-conductive patterns described with reference to FIGS. 4 to 8.

Forming the conductive line hole MH11 may include manufacturing the first photomask using the first pattern group, forming a first photoresist pattern on the third interlayer insulating layer 130 by the first photolithography process using the first photomask, and etching the third interlayer insulating layer 130 using the first photoresist pattern as an etch mask to form the conductive line hole MH11.

Referring to FIGS. 13A, 13B, 13C, and 13D, a conductive line MI11 may be formed to fill the conductive line hole MH11. A fourth interlayer insulating layer 140 may be formed on the third interlayer insulating layer 130, and a second via V2 may be formed to penetrate the fourth interlayer insulating layer 140. In some exemplary embodiments, the second via V2 may electrically connect the conductive line MI11 to a conductive line to be formed in a conductive line hole MH23. A fifth interlayer insulating layer 150 may be formed on the fourth interlayer insulating layer 140.

A second photolithography process using a second photomask and an etching process may be performed to form conductive line holes MH21, MH22, and MH23 penetrating the fifth interlayer insulating layer 150. The second photomask may be manufactured using a second pattern group including the conductive patterns M21, M22, and M23 described with reference to FIGS. 4 to 6. Forming the conductive line holes MH21, MH22, and MH23 may include manufacturing the second photomask using the second pattern group, forming a second photoresist pattern on a mask layer by the second photolithography process using the second photomask, and etching the mask layer and the fifth interlayer insulating layer 150 using the second photoresist pattern as an etch mask to form the conductive line holes MH21, MH22, and MH23. As described with reference to FIGS. 4 to 6, the conductive line holes M21, M23, and M22 may be respectively formed on the track 2, the track 3, and the track 4 arranged along the second direction D2.

Referring to FIGS. 14A, 14B, 14C, and 14D, conductive lines MI21, MI22, and MI23 may be formed in the conductive line holes MH21, MH22, and MH23, respectively. The conductive lines MI21, MI22, and MI23 may correspond to the conductive patterns M21, M22, and M23 of FIG. 6, respectively. In some exemplary embodiments, a conductive layer may be formed to fill the conductive line holes MH21, MH22, and MH23, and a planarization process may be performed on the conductive layer to form the conductive lines MI21, MI22, and MI23. The conductive line MI21 may be formed on the track 2, the conductive line MI22 may be formed on the track 4, and the conductive line MI23 may be formed on the track 3.

Since the conductive line MI22 is formed on the track 4 not to be directly adjacent to the conductive line MI21, a routing problem with respect to the conductive line MI11 may be prevented. If a conductive line MI22' is disposed directly adjacent to the conductive line MI21 (see FIG. 14A) unlike the conductive lines according to exemplary embodiments, the routing problem may be caused by a short distance s1 between the conductive line MI22' and the conductive line MI23. In other words, a routing process of connecting the conductive line MI11 to another conductive line through the conductive line MI23 may not be performed unless a design of the conductive line MI11 disposed on the tracks 2 and 3 is changed to extend onto another track (e.g., the track 1).

As described above, since the conductive lines are (re) arranged and thus are not disposed on two tracks adjacent to each other in the vicinity of the cell boundary, it is possible to prevent problems which may be caused in a routing process of conductive lines. In addition, a time used to change the design of the layout may be reduced.

Figure 15:
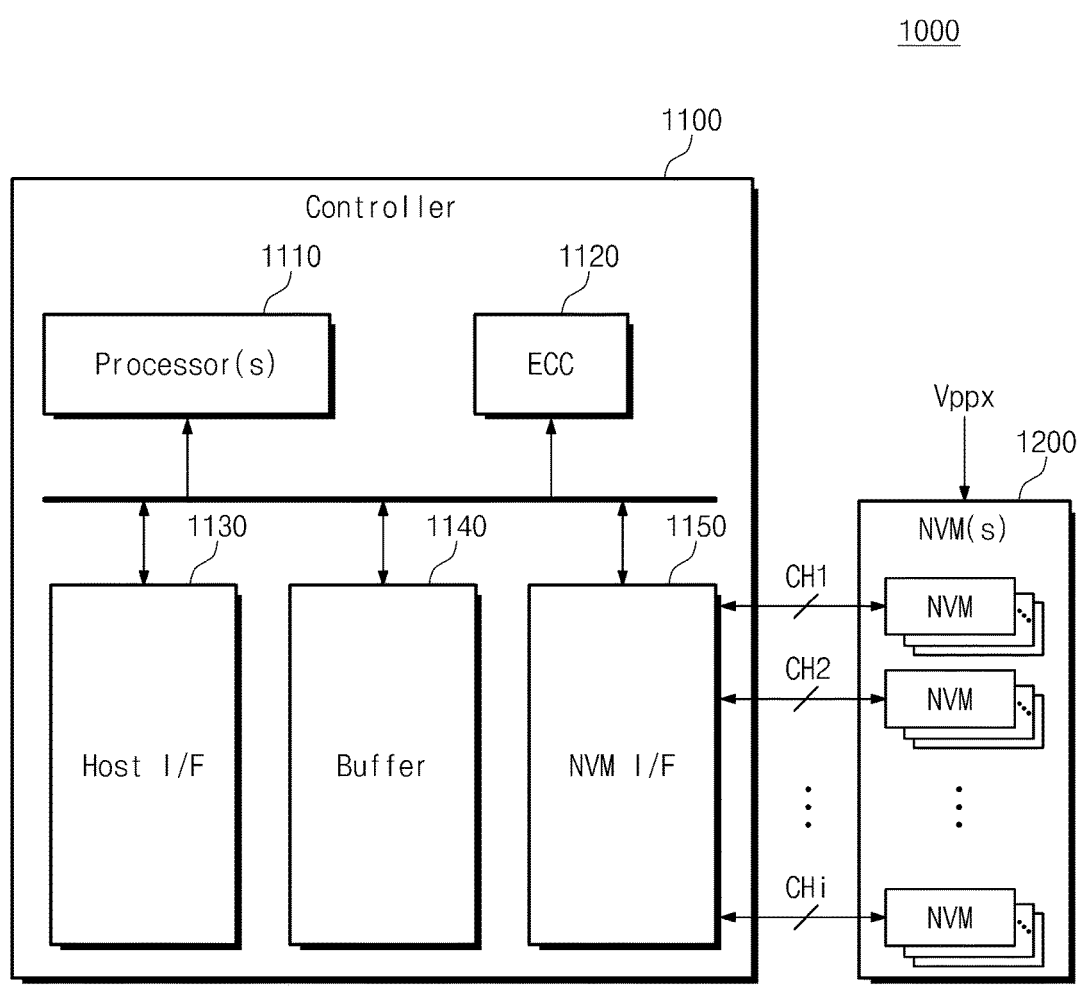
FIG. 15 is a schematic block diagram illustrating a solid state drive (SSD) implemented with a method for designing a layout of a semiconductor device, according to an exemplary embodiment.

FIG. 15 is a schematic block diagram illustrating a solid state drive (SSD) implemented with a method for designing a layout of a semiconductor device, according to some exemplary embodiments. Referring to FIG. 15, a SSD 1000 may include a controller 1100 and a plurality of non-volatile memories 1200. At least one of the controller 1100 or the non-volatile memories 1200 may include the semiconductor device manufactured according to the layout designing method described above.

The controller 1100 may be connected to the non-volatile memories 1200 through a plurality of channels CH1 to CHi (i.e., "i" is an integer of 2 or more). The non-volatile memories 1200 connected to the controller 1100 through the same channel may be provided in the form of a multi-stack chip package. In some exemplary embodiments, the non-volatile memories 1200 may receive an external high-voltage Vppx. The controller 1100 may include at least one processor 1110, an error correction circuit (ECC) 1120, a host interface (I/F) 1130, a buffer 1140, and a non-volatile memory interface (NVM I/F) 1150.

The host interface (I/F) 1130 may provide an interface function for interfacing with an external device. For example, the host interface (I/F) 1130 may be a NAND flash interface unit. In certain exemplary embodiments, the host interface (I/F) 1130 may be implemented by one or more of other various interfaces. The error correction circuit (ECC) 1120 may calculate a value of an error correction code of data to be programmed in a writing operation and may correct data read in a reading operation based on the value of the error correction code. In addition, the error correction circuit (ECC) 1120 may correct an error of data recovered from the non-volatile memories 1200 in a data recovery operation. Although not illustrated, the SSD 1000 may further include a code memory that stores code data for operating the controller 1100. The code memory may be implemented with a non-volatile memory. The buffer 1140 may temporarily store data for operating the controller 1100. The buffer 1140 may temporarily store data to be programmed to the non-volatile memories 1200, or may temporarily store data which was read from the non-volatile memories 1200. The non-volatile memory interface unit 1150 may provide an interface function between the controller 1100 and the non-volatile memories 1200.

According to some exemplary embodiments, it is possible to efficiently design the layout adjacent to the cell boundary of the semiconductor device.

While the inventive concepts have been described with reference to certain exemplary embodiments, it will be apparent to those skilled in the art that various changes and modifications may be made without departing from the spirits and scopes of the inventive concepts. Therefore, it should be understood that the above exemplary embodiments are not limiting, but illustrative. Thus, the scopes of the inventive concepts are to be determined by the broadest reasonable interpretation of the following claims and their equivalents, and shall not be restricted or limited by the foregoing description.

What is claimed is:

1. A method for manufacturing a semiconductor device, the method comprising:
    disposing pre-conductive lines for forming a first cell and a second cell, the first cell and the second cell being adjacent to each other in a first direction, and a first conductive line of the pre-conductive lines of the first cell extending in a second direction perpendicular to the first direction and being adjacent to a boundary between the first and second cells; and
    disposing post-conductive lines for forming the first cell and the second cell, a second conductive line and a third conductive line among the post-conductive lines of the second cell extending in the first direction and being adjacent to the boundary,
    wherein the second conductive line and the third conductive line are respectively disposed on two non-adjacent tracks among a plurality of tracks that extend in the first direction, and
    wherein the first conductive line intersects at least one of the two non-adjacent tracks and at least one track disposed between the two non-adjacent tracks.

2. The method of claim 1, wherein a distance between the second conductive line and the third conductive line is greater than a width of at least one track.

3. The method of claim 1, wherein the first conductive line is spaced apart from one of the second conductive line and third conductive line by at least a first reference distance.

4. The method of claim 3, further comprising disposing a fourth conductive line on at least one track disposed between the non-adjacent two tracks, the fourth conductive line being disposed in the first cell,
    wherein the fourth conductive line overlaps the first conductive line when viewed from a plan view.

5. The method of claim 4, further comprising disposing a fifth conductive line on at least one track disposed between the two non-adjacent tracks, the fifth conductive line being disposed in the second cell,
    wherein the fifth conductive line is spaced apart from the fourth conductive line by a second reference distance that is greater than the first reference distance.

6. The method of claim 1, wherein the first conductive line has at least two hit-points at positions at which the first conductive line overlaps the plurality of tracks in a plan view, and
    wherein the at least two hit-points are connectable to other conductive lines.

7. The method of claim 1, wherein the pre-conductive lines are formed by a patterning process using a first photomask, and
    wherein the post-conductive lines are formed by a patterning process using a second photomask that is different from the first photomask.

8. The method of claim 1, further comprising, before disposing the pre-conductive lines and the post-conductive lines:
    defining an active pattern on a substrate;
    forming a gate electrode intersecting the active pattern; and
    forming a source region and a drain region on the active pattern at both sides of the gate electrode,
    wherein at least one of the pre-conductive lines and the post-conductive lines is electrically connected to the gate electrode, and
    wherein at least another one of the pre-conductive lines and the post-conductive lines is electrically connected to the source region or the drain region.

9. A semiconductor device comprising:
    a substrate including a PMOSFET region and an NMOSFET region;
    pre-conductive lines that form a first cell and a second cell adjacent to each other in a first direction on the substrate, a first conductive line of the pre-conductive lines of the first cell extending in a second direction perpendicular to the first direction and being adjacent to a boundary between the first and second cells; and post-conductive lines that form the first cell and the second cell, a second conductive line and a third conductive line among the post-conductive lines of the second cell extending in the first direction and being adjacent to the boundary, wherein the second conductive line and the third conductive line are respectively disposed on two non-adjacent tracks among a plurality of tracks that extend in the first direction, and wherein the first conductive line intersects at least one of the two non-adjacent tracks and at least one track disposed between the two non-adjacent tracks.

10. The semiconductor device of claim 9, wherein a distance between the second conductive line and the third conductive line is greater than a width of at least one track.

11. The semiconductor device of claim 9, wherein the first conductive line is spaced apart from one of the second conductive line and third conductive line by at least a first reference distance.

12. The semiconductor device of claim 9, further comprising a fourth conductive line disposed on at least one track disposed between the two non-adjacent tracks, the fourth conductive line being disposed in the first cell, wherein the fourth conductive line overlaps the first conductive line when viewed from a plan view.

13. The semiconductor device of claim 12, further comprising:

a fifth conductive line disposed on at least one track disposed between the two non-adjacent tracks, the fifth conductive line being disposed in the second cell, wherein the fifth conductive line is spaced apart from the fourth conductive line by a second reference distance that is greater than the first reference distance.

14. The semiconductor device of claim 9, wherein the first conductive line has at least two hit-points at positions at which the first conductive line overlaps the plurality of tracks in a plan view, and wherein the at least two hit-points are connectable to other conductive lines.

15. The semiconductor device of claim 9, further comprising:

an active pattern defined on a substrate;
a gate electrode intersecting the active pattern; and
a source region and a drain region formed on the active pattern at both sides of the gate electrode, wherein at least one of the pre-conductive lines and the post-conductive lines is electrically connected to the gate electrode, and wherein at least another one of the pre-conductive lines and the post-conductive lines is electrically connected to the source region or the drain region.

16. A method for manufacturing a semiconductor device, the method comprising:

laying out a plurality of pre-conductive lines forming a first cell and a second cell, the first cell and the second cell being adjacent to each other in a first direction and sharing a cell boundary, a first conductive line of the pre-conductive lines of the first cell extending in a second direction perpendicular to the first direction; and initially laying out, in an initial layout, a plurality of post-conductive lines forming the first cell and the second cell, a second conductive line and a third conductive line among the post-conductive lines of the second cell extending in the first direction, the first conductive line being separated from the second and third conductive lines by a separation distance across the cell boundary, and the second conductive line and the third conductive line being disposed on adjacent tracks among a plurality of tracks extending in the first direction; and rearranging the initial layout of one of the second and third conductive lines such that the second conductive line and the third conductive line are respectively disposed on two non-adjacent tracks among the plurality of tracks, wherein the first conductive line intersects at least one of the two non-adjacent tracks and at least one track disposed between the two non-adjacent tracks.

17. The method of claim 16, wherein the initial layout is rearranged while maintaining the separation distance between the first conductive line, and the second and third conductive lines.

18. The method of claim 17, further comprising laying out a fourth conductive line on at least one track disposed between the two non-adjacent tracks, the fourth conductive line being disposed in the first cell and overlapping the first conductive line.

19. The method of claim 18, further comprising laying out a fifth conductive line on at least one track disposed between the two non-adjacent tracks, the fifth conductive line being disposed in the second cell, wherein the fifth conductive line is spaced apart from the fourth conductive line by a distance that is greater than the separation distance.

20. The method of claim 16, wherein the initial layout is rearranged without increasing the separation distance between the first conductive line, and the second and third conductive lines.

* * * * *